(12) United States Patent
Kou

(10) Patent No.: US 7,808,749 B2
(45) Date of Patent: Oct. 5, 2010

(54) MAGNETORESISTANCE EFFECT ELEMENT, SUBSTRATE THEREFOR AND MANUFACTURING METHOD THEREOF

(75) Inventor: Futoyoshi Kou, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 873 days.

(21) Appl. No.: 11/713,050

(22) Filed: Mar. 2, 2007

(65) Prior Publication Data

US 2007/0205766 A1 Sep. 6, 2007

(30) Foreign Application Priority Data

Mar. 3, 2006 (JP) .............. 2006-057986
Mar. 3, 2006 (JP) .............. 2006-058012

(51) Int. Cl.
*G11B 5/127* (2006.01)
(52) U.S. Cl. ................................. 360/324.1
(58) Field of Classification Search ............... None
See application file for complete search history.

(56) References Cited

U.S. PATENT DOCUMENTS

| | | | |
|---|---|---|---|
| 5,668,688 A | 9/1997 | Dykes et al. | |
| 6,633,462 B2 | 10/2003 | Adelerhof | |
| 7,023,310 B2 * | 4/2006 | Oohashi et al. | ............. 335/306 |
| 2001/0026425 A1 | 10/2001 | Miyazawa et al. | |
| 2004/0087037 A1 | 5/2004 | Berg et al. | |
| 2004/0130323 A1 | 7/2004 | Oohashi et al. | |
| 2005/0219767 A1 | 10/2005 | Nakamura et al. | |
| 2005/0270020 A1 | 12/2005 | Peczalski et al. | |
| 2007/0047152 A1 * | 3/2007 | Furukawa et al. | ........... 360/319 |

FOREIGN PATENT DOCUMENTS

| | | |
|---|---|---|
| JP | 02-061572 | 3/1990 |
| JP | 10-198922 | 7/1998 |
| JP | 2002-117508 | 4/2002 |
| JP | 2003-008101 | 1/2003 |
| JP | 2003-167039 | 6/2003 |
| JP | 2004-006752 A | 1/2004 |
| JP | 2004-012156 A | 1/2004 |
| JP | 2004-354182 | 12/2004 |
| JP | 2005-260064 | 9/2005 |

* cited by examiner

*Primary Examiner*—Mark Blouin
(74) *Attorney, Agent, or Firm*—Dickstein Shapiro LLP

(57) ABSTRACT

A magnetoresistance effect element which is used in a magnetic sensor is disclosed. The magnetoresistance effect element includes a soft layer whose magnetization easy direction is changed by a direction of an external magnetic field, and a magnetization fixing layer whose magnetization direction is fixed by having a magnetic layer and an anti-ferromagnetic layer. A magnetoresistance effect is generated by a change of electric conduction which is caused by a relative angle between the magnetization easy direction of the soft layer and the magnetization direction of the magnetization fixing layer. When the magnetic sensor includes two or more magnetoresistance effect elements for having two-axis or more vectors of the magnetization directions, the two or more magnetoresistance effect elements are adjacently disposed.

20 Claims, 19 Drawing Sheets

(a)

(b)

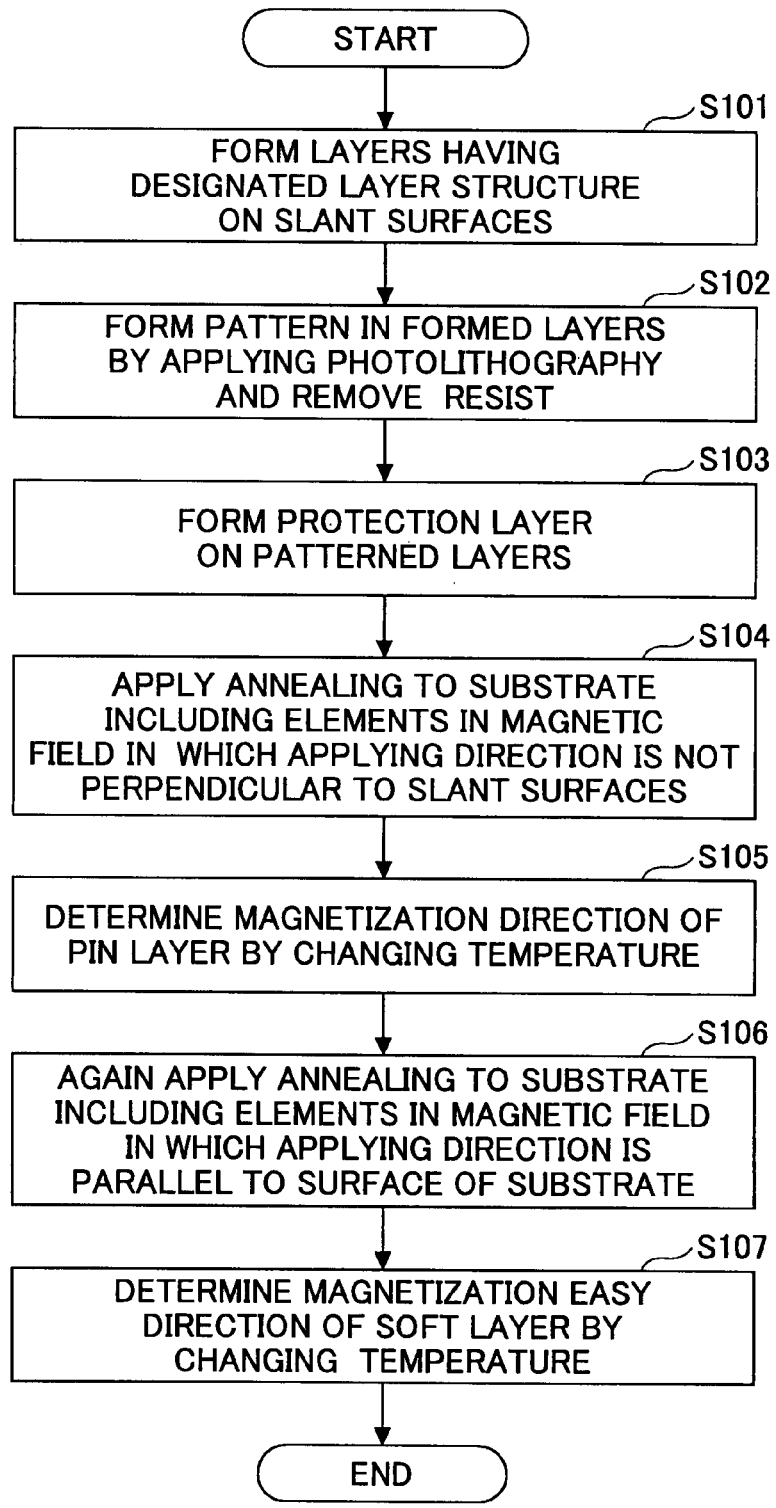

ANGLE: 45°
BROKEN LINE: PERMALLOY
CONTINUOUS LINE: Co-Fe

MAGNETORESISTANCE EFFECT ELEMENT, SUBSTRATE THEREFOR AND MANUFACTURING METHOD THEREOF

BACKGROUND OF THE INVENTION

1. Field of the Invention

The present invention generally relates to a magnetoresistance effect element, a substrate therefor, and a manufacturing method thereof, which element is used for a sensor capable of detecting a vector in a magnetic field such as in an electronic compass, a recording device, a signal processing device, and so on.

2. Description of the Related Art

As sensors, there are a magnetoresistance effect element (MR element) sensor, a magnetoimpedance element (MI element) sensor, a fluxgate sensor, and a semiconductor Hall effect sensor. For example, when an MI element is used for a sensor, the sensor can be made thin and miniaturized. In a case where an MR element is used for a sensor, the sensor can detect magnetic field intensity by a high frequency impedance change caused by a magnetic field when a high frequency current flows.

As the magnetic sensors, a giant magnetoresistance effect element (GMR element) and a tunneling magnetoresistance effect element (TMR element) have been utilized. In the GMR element, ferromagnetic layers and non-ferromagnetic layers are alternately stacked plural times, and magnetism is detected by utilizing a resistance change between the magnetization directions of adjacent two magnetic layers that are parallel and non-parallel caused by intensity of an external magnetic field. In the TMR element, plural magnetic thin film layers are formed by sandwiching an insulation layer therebetween, and electrons are transmitted through the insulation layer by tunneling while maintaining a spin. Then a magnetic field is detected by utilizing the fact that tunnel transmission coefficients are different between magnetized conditions.

Since the ferromagnetic tunnel effect has very high magnetic sensitivity, the effect can be used for a magnetic reproducing head of an HDD in ultrahigh-density magnetic recording. In addition, the ferromagnetic tunnel effect may be used for a magnetic sensor for a magnetic field measuring instrument of motors, for a car navigation system, and a magnetic solid memory device such as an MRAM (magnetic random access memory).

In Patent Documents 1 through 6, the technology of magnetic sensors is disclosed. In Patent Document 1, a thin film magnetic sensor is disclosed. In the sensor, in order to improve low magnetic field sensitivity of a granule film, the granule film is disposed on a slant surface of a supporting soft film. With this, the thin film magnetic sensor can detect plural magnetic fields. In Patent Document 2, a spin-valve magnetic head is disclosed. In the head, magnetic intensity between PIN layers is different due to a magnetizing method in a spin-valve structure. In order to solve the above problem, a proper thickness of a ferromagnetic film is used and heat treatment is applied to the film.

In Patent Document 3, a manufacturing method of a two-axial magnetic sensor is disclosed in which magnetic detecting directions are orthogonal. In the sensor, an array of permanent magnets is arranged in which the polarity of the permanent magnets is alternately disposed. In Patent Document 4, a magnetic sensor and a magnetic recording/reproducing apparatus using the sensor are disclosed. In the magnetic sensor, a spin-valve laminated film having high coupling and high thermal stability is provided. With this, a high-reliability sensor, a magnetic recording apparatus whose recording density is high, and a magnetoresistance effect recording head and a magnetoresistance effect reproducing head having high sensitivity and low noise are provided. In the sensor, Ir—Mn and Fe—Mn are used and a spin-valve structure is used.

Technologies in Patent Documents 5 and 6 are disclosed by the applicant of the present invention.

In Patent Document 5, a magnetic sensor and an azimuth detecting system using the sensor are disclosed. In this, the magnetic sensor is small-sized and light-weighted with high sensitivity. In the sensor, plural thin film magnetoresistance effect elements are arrayed in parallel which elements can obtain binary magnetization conditions. With this, the sensor can detect magnetism. The azimuth detecting system includes the magnetic sensors disposed on three axes, a vector detecting unit for detecting vectors of the three axes or more, a comparing unit for comparing an absolute value of the detected result with a predetermined threshold, and an informing unit for informing others of the compared result.

In Patent Document 6, a tunneling magnetoresistance effect element (TMR element) and an azimuth detecting system using the elements is disclosed. In this, the TMR element is small-sized and light-weight with high sensitivity. In the TMR element, a structure is disclosed which structure is needed to detect terrestrial magnetism with high sensitivity. In addition, similar to Patent Document 5, the azimuth detecting system includes the TMR elements disposed on three axes, a vector detecting unit for detecting vectors of the three axes or more, a comparing unit for comparing an absolute value of the detected result with a predetermined threshold, and an informing unit for informing others of the compared result. Further, the azimuth detecting system resets the TMR elements depending on the detected result of the detecting unit.

[Patent Document 1] Japanese Laid-Open Patent Application No. 2004-354182

[Patent Document 2] Japanese Laid-Open Patent Application No. 2002-117508

[Patent Document 3] Japanese Laid-Open Patent Application No. 2005-260064

[Patent Document 4] Japanese Laid-Open Patent Application No. 10-198922

[Patent Document 5] Japanese Laid-Open Patent Application No. 2003-167039

[Patent Document 6] Japanese Laid-Open Patent Application No. 2003-008101

As described above, the tunneling magnetic sensor using TMR elements has high sensitivity. In many cases, the tunneling magnetic sensor has a layer structure formed of a magnetic metal layer (soft layer), an insulation layer, and a magnetic metal layer (magnetization fixing layer), and the insulation layer is formed of an inorganic thin film of approximately 1 nm thickness. In addition, in the spin-valve structure, a magnetization state is fixed by an exchange interaction at a boundary surface between an anti-ferromagnetic layer and a magnetic layer. That is, tunneling probability is changed by a relative angle between the magnetization fixing layer and the soft layer. By the above change, a resistance value is changed, and a magnetic change of the soft layer is detected. The characteristics of the PIN layer are important along with the characteristics of the soft layer, and the characteristics of a magnetic sensor, a magnetic head, and an MRAM have been extremely increased by improvement of the above characteristics.

However, in the magnetic sensor, a monolithic layer structure and multi axes are required. That is, PIN layers each having a different magnetization direction must be adjacently disposed.

SUMMARY OF THE INVENTION

In a preferred embodiment of the present invention, there is provided a magnetoresistance effect element, a substrate therefor, and a manufacturing method thereof, in which two or more elements having a magnetization fixing layer are disposed in a magnetic sensor so that the magnetic sensor has two-axis or more vector magnetization directions. Further, in the magnetoresistance effect element, the magnetization fixing layer is formed of a thin film and the magnetization direction to the magnetization fixing layer is not perpendicular to the film surface of the magnetization fixing layer.

Features and advantages of the present invention are set forth in the description that follows, and in part will become apparent from the description and the accompanying drawings, or may be learned by practice of the invention according to the teachings provided in the description. Features and advantages of the present invention will be realized and attained by a magnetoresistance effect element, a substrate therefor, and a manufacturing method thereof particularly pointed out in the specification in such full, clear, concise, and exact terms as to enable a person having ordinary skill in the art to practice the invention.

To achieve one or more of these and other advantages, according to one aspect of the present invention, there is provided a magnetoresistance effect element which is used in a magnetic sensor. The magnetoresistance effect element includes a soft layer whose magnetization easy direction is changed by a direction of an external magnetic field, and a magnetization fixing layer whose magnetization direction is fixed by having a magnetic layer and an anti-ferromagnetic layer. A magnetoresistance effect is generated by a change of electric conduction which is caused by a relative angle between the magnetization easy direction of the soft layer and the magnetization direction of the magnetization fixing layer. When the magnetic sensor includes two or more magnetoresistance effect elements for having two-axis or more vectors of the magnetization directions, the two or more magnetoresistance effect elements are adjacently disposed.

According to another aspect of the present invention, there is provided a manufacturing method of a magnetoresistance effect element which is used in a magnetic sensor. The magnetoresistance effect element includes a soft layer whose magnetization easy direction is changed by a direction of an external magnetic field, and a magnetization fixing layer whose magnetization direction is fixed by having a magnetic layer and an anti-ferromagnetic layer. A magnetoresistance effect is generated by a change of electric conduction which is caused by a relative angle between the magnetization easy direction of the soft layer and the magnetization direction of the magnetization fixing layer. The manufacturing method includes a thin film forming step which forms the magnetization fixing layer into a thin film, and a magnetization applying step which forms a magnetization direction of the magnetization fixing layer by applying a magnetic field to the magnetization fixing layer from a direction other than a film surface direction of the magnetization fixing layer.

EFFECT OF THE INVENTION

According to an embodiment of the present invention, a magnetoresistance effect element, a substrate therefor, and a manufacturing method thereof can be provided. In the embodiment, two or more magnetoresistance effect elements having a magnetization fixing layer are disposed in a magnetic sensor so that the magnetic sensor has two-axis or more vector magnetization directions. Further, in the magnetoresistance effect element, the magnetization fixing layer is formed of a thin film and the magnetization direction of the magnetization fixing layer is not perpendicular to the film surface of the magnetization fixing layer. Therefore, a small-sized and light-weighted magnetic sensor having multi-axis direction detect-ability can be realized.

BRIEF DESCRIPTION OF THE DRAWINGS

Features and advantages of the present invention will become more apparent from the following detailed description when read in conjunction with the accompanying drawings, in which:

FIG. 5 is a flowchart showing processes to manufacture the magnetoresistance effect elements shown in FIG. 1;

DESCRIPTION OF THE PREFERRED EMBODIMENTS

Figure 1:
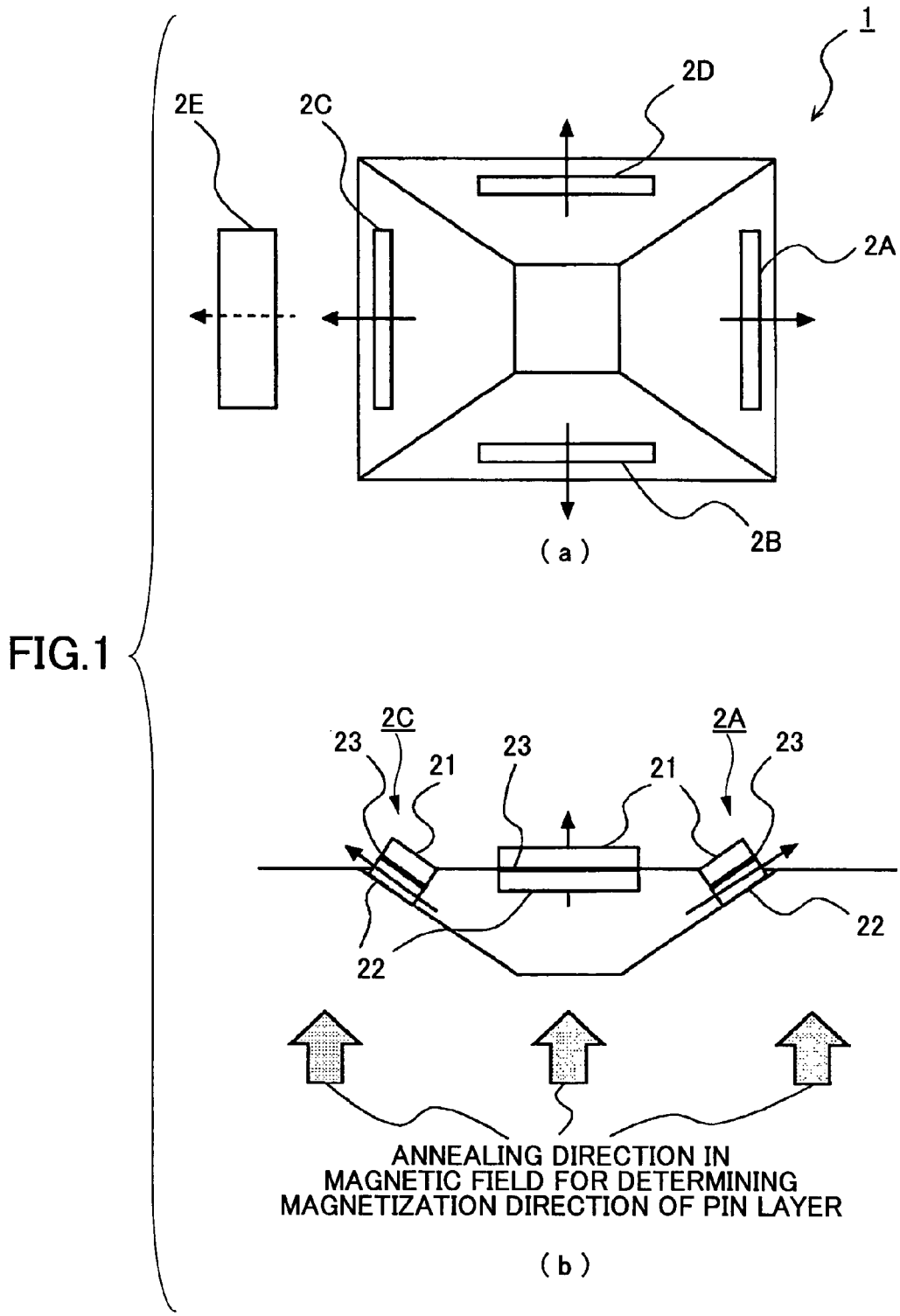
FIG. 1 is a diagram showing magnetoresistance effect elements in a magnetic sensor according to a first embodiment of the present invention.

Best Mode of Carrying Out the Invention

The best mode of carrying out the present invention is described with reference to the accompanying drawings.

In embodiments of the present invention, an annealing direction in a magnetic field is focused for a PIN layer which is disposed on a substrate having a three-dimensional structure.

In the embodiments of the present invention, the following characteristic of a thin film magnetic layer is utilized. That is, in the thin film magnetic layer of a magnetoresistance effect element, when crystal magnetic anisotropy perpendicular to a film surface is weak, a magnetization easy direction is in the film surface. When the above characteristic is considered, it is preferable that the thickness of the thin film magnetic layer be 1 μm or less.

That is, in the embodiments of the present invention, a magnetic sensor capable of detecting magnetization directions of multi-axis vectors is realized. The sensor has plural detecting axes in which magnetoresistance effect elements are not disposed in a plane. At this time, a magnetization direction of a magnetization fixing layer which is a reference of a detecting axis is focused and a structure is realized in which the magnetization directions have plural axes and the multi-axis vectors can be detected. In addition, in order to miniaturize the magnetic sensor, a monolithic structure is realized and low cost and high efficiency are realized in a manufacturing method of the magnetoresistance effect element in the magnetic sensor.

First Embodiment

Referring now to the drawings, a first embodiment of the present invention is described.

FIG. 1 is a diagram showing magnetoresistance effect elements in a magnetic sensor according to the first embodiment of the present invention. In FIG. 1, a magnetic sensor 1 has multi-axes and a monolithic structure in which plural magnetoresistance effect elements are disposed. In FIG. 1, (a) shows a plan view and (b) shows a side view. In FIG. 1(b), the magnetoresistance effect elements are enlarged.

In FIG. 1, a conventional magnetoresistance effect element 2E is disposed in a plane to perform a next process. The magnetoresistance effect element 2E can be a tunneling magnetoresistance effect (TMR) element. The direction of the magnetoresistance effect element 2E is not limited to in the plane. When a differential between the element 2E and, for example, the element 2C is obtained, the axis for the magnetic sensor 1 can be detected at low noise. Specifically, in the first embodiment of the present invention, the magnetoresistance effect element 2E is not used.

As shown in FIG. 1, the magnetic sensor 1 includes plural magnetoresistance effect elements 2A, 2B, 2C, and 2D. The magnetoresistance effect elements 2A through 2D are TMR (tunneling magnetoresistance effect) elements.

The structure of the TMR elements 2A through 2D is the same; therefore, the structure of the TMR element 2A is described as the representative.

As shown in FIG. 1(b), the TMR element 2A includes a soft layer 21, a PIN layer 22, and an insulation layer 23. In the soft layer 21, the magnetization direction is changed corresponding to an external magnetic field direction, and in the PIN layer 22, the magnetization direction is fixed regardless of the external magnetic field direction. The insulation layer 23 operates as a tunneling layer by being sandwiched between the soft layer 21 and the PIN layer 22.

Actually, since a magnetic substance is disposed near the TMR element 2A, a magnetic field is taken inside the TMR element 2A, and an effective magnetic field is generated in a slant direction by a part of the magnetic field projected on the film surface of the TMR element 2A. Consequently, the magnetization direction of the PIN layer 22 of the TMR element 2A can be an opposite direction to that of the PIN layer 22 of the TMR element 2C in the film surface. That is, as shown in arrows of FIG. 1(b), the magnetization directions of the PIN layers 22 of the TMR elements 2A and 2C are opposite directions.

In addition, the magnetization directions can have 90° between the adjacent two TMR elements as shown in arrows of FIG. 1(a). In addition, generally, the relative angle between the magnetization direction of the soft layer 21 and that of the PIN layer 22 is approximately 90°. With this, excellent characteristics can be obtained.

Figure 2:
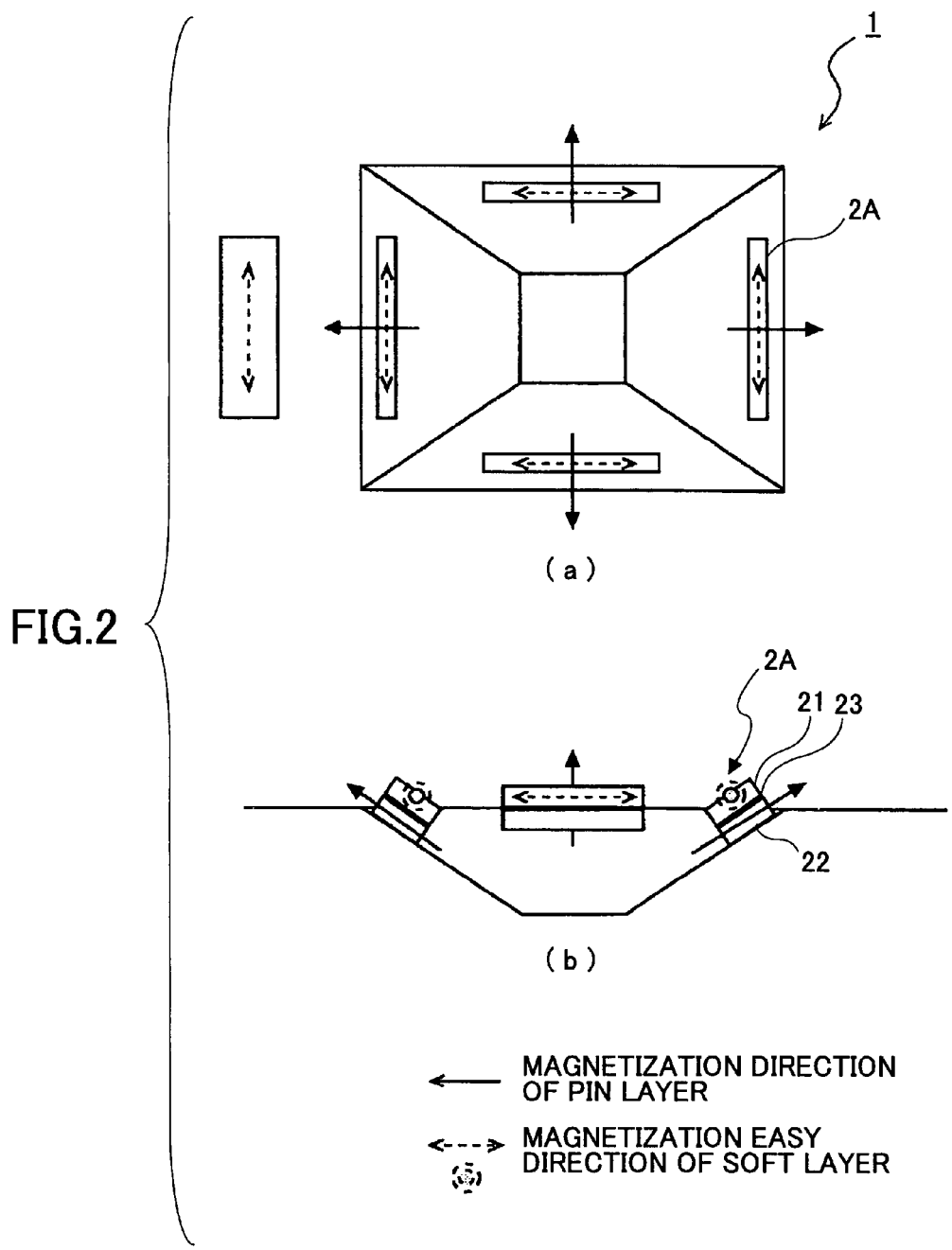
FIG. 2 is a diagram showing the magnetic sensor shown in FIG. 1 in which a magnetization direction of a PIN layer and a magnetization easy direction of a soft layer are shown.

FIG. 2 is a diagram showing the magnetic sensor 1 shown in FIG. 1 in which the magnetization direction of the PIN layer 22 and the magnetization easy direction of the soft layer 21 are shown. In FIG. 2, (a) shows a plan view and (b) shows a side view. In FIG. 2(b), the size of each magnetoresistance effect element is enlarged.

As shown in FIG. 2, the magnetization easy direction of the soft layer 21 can be easily determined by the outer shape and the slant surface of the TMR element 2A. In FIG. 2, the continuous arrow line shows the magnetization direction of the PIN layer 22 and the broken arrow line shows the magnetization easy direction of the soft layer 21.

That is, when each TMR element is formed on a corresponding slant surface of a substrate and an annealing direction in a magnetic field is not perpendicular to the slant surface, the magnetic sensor 1 can obtain a detection angle which is perpendicular to the substrate of the magnetic sensor 1. In addition, annealing can be applied in the conditions that only a vector component of a magnetic field is applied to each TMR element in a magnetic field; therefore, the TMR elements 2A through 2D can have a monolithic structure.

In the present embodiment, the outer shape of the TMR element 2A is obtained from conditions for applying an annealing process in a magnetic field while considering characteristics and slant surfaces of the substrate. In addition, the characteristics of the magnetic sensor 1 are changed by the size of the TMR-element 2A. As shown in FIG. 1, the outer shape is a rectangle; however, the outer shape can be a circle, an ellipse, or an asymmetric shape.

In the present embodiment, the substrate of the TMR element 2A can be formed of a non-conductive ceramics, or a material such as a conductive ceramics, a semiconductor, and a metal plate on which an insulation layer is formed. The substrate can be formed by applying anisotropic etching to the above material, for example, Si. In addition, as shown in FIG. 1, the shape of the substrate is a quadrangular pyramid, that is, an inner surface of the quadrangular pyramid is used. However, the shape can be a triangular pyramid, a multi-angular pyramid, or a circular cone. The shape of the substrate can be arbitrarily determined corresponding to the axis direction and the magnetization fixing conditions thereof.

In addition, a magnetic field can be uniformly applied to the TMR element 2A or only to a magnetization fixing layer of the TMR element 2A. In addition, annealing in the magnetic field is suitable in a vacuum. However, when high preciseness of the TMR element 2A is not required, the annealing in the magnetic field can be at atmospheric pressure or reduced pressure.

In addition, the applying magnetic field intensity is suitable to be some 100 Oe to some 1000 Oe. However, in the present embodiment, the applying magnetic field intensity can be arbitrarily determined, and even if the applying magnetic field intensity is some 10 Oe or less, a TMR element which suitably functions can be realized.

For example, when a permalloy (for example, Fe—Ni alloy) is used for the soft layer 21; by some 10 Oe, the magnetization is sufficiently saturated; however, the effective magnetic field at a position other than the film surface is remarkably lowered by shape anisotropy. However, the flow of magnetic flux can be controlled and the magnetic field intensity can operate to determine the magnetization direction of the magnetic layer.

In many cases, a material of Co—Fe or an alloy of Fe is used for the magnetic layer. However, it is different from the soft layer 21 using the permalloy; the magnetic field is not saturated in the magnetic layer. The flux amount is sufficiently large in the magnetic layer; therefore, the magnetization on the film surface can be sufficiently determined. Therefore, the magnetization directions of the soft layer 21 and the PIN layer 22 can be separated.

The effective magnetic field intensity is described below.

Figure 3:
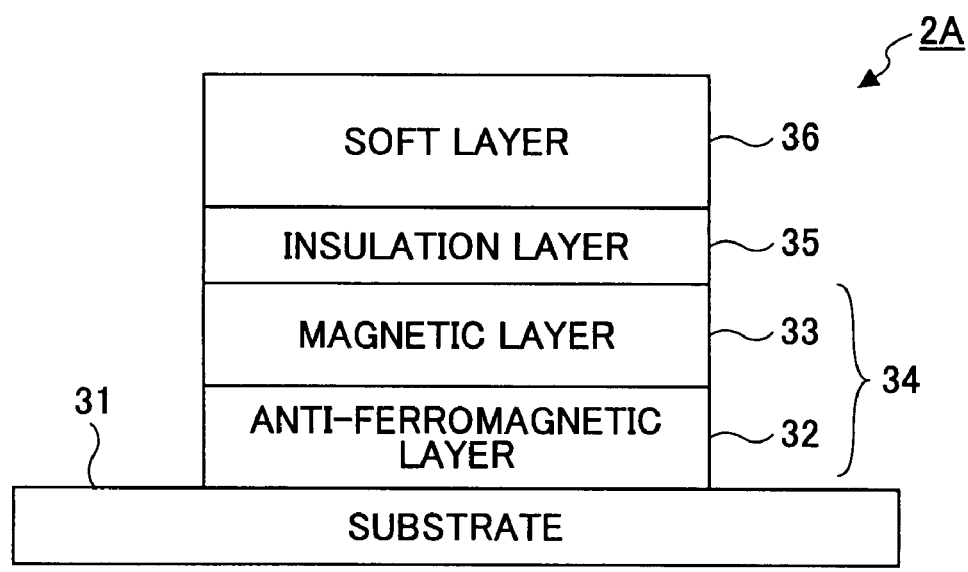
FIG. 3 is a diagram showing a structure of the magnetoresistance effect element shown in FIG. 1.

The magnetoresistance effect element 2A is described in detail. FIG. 3 is a diagram showing a structure of the magnetoresistance effect element 2A.

As shown in FIG. 3, first, a PIN layer 34 is stacked on a substrate 31. The PIN layer 34 is formed of an anti-ferromagnetic layer 32 made of, for example, Fe—Ni, and a magnetic layer 33 made of, for example, Co—Fe. Next, an insulation layer 35 is stacked on the PIN layer 34, and a soft layer 36 is further stacked on the insulation layer 35. With this, the TMR element 2A is formed. For the insulation layer 35, an insulation material such as $SiO_2$ or a non-magnetic metal oxide such as $Al_2O_3$ can be used. For the soft layer 36, a material such as Co—Fe can be used. In addition, the anti-ferromagnetic layer 32 can be formed to have a slant surface. The thickness of the PIN layer 34 is 1 μm or less.

Figure 4A:
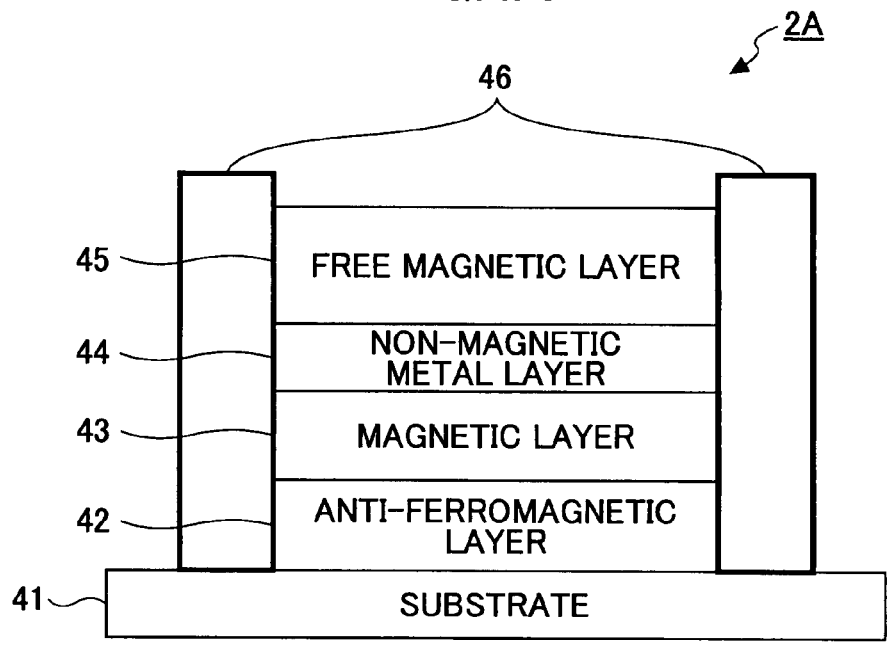
FIG. 4A is a diagram showing a structure of a horizontal type GMR element.
Figure 4B:
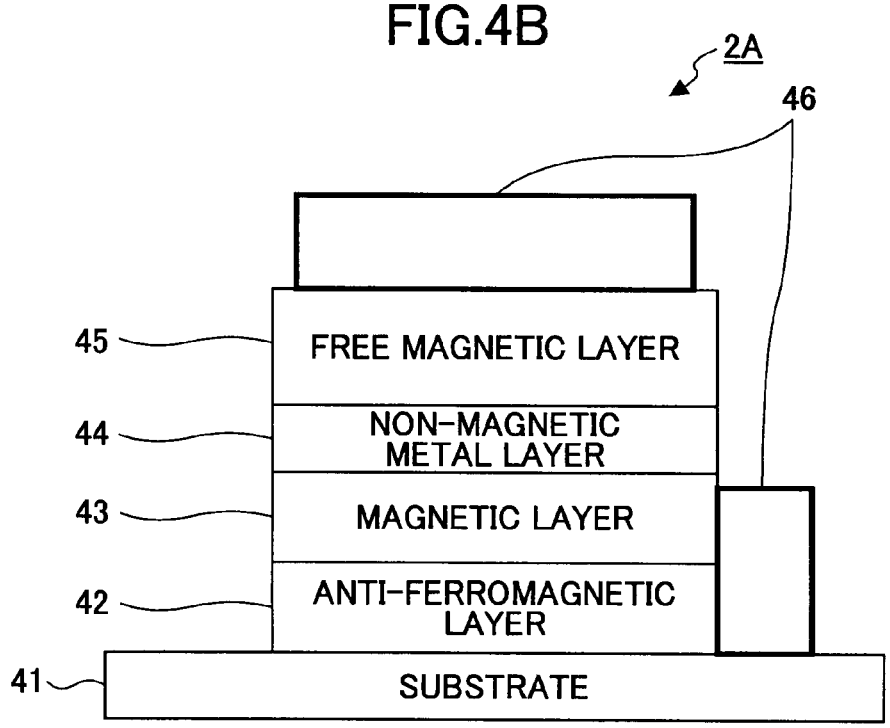
FIG. 4B is a diagram showing a structure of a vertical type GMR element.

In the above, the TMR elements 2A through 2D are used in the magnetic sensor 1. However, GMR (giant MR) elements can be used in the magnetic sensor 1 instead of the TMR elements. FIG. 4A is a diagram showing a structure of a horizontal type GMR element. FIG. 4B is a diagram showing a structure of a vertical type GMR element. In FIGS. 4A and 4B, the GMR element is a spin-valve type element.

In the horizontal type GMR element, as shown in FIG. 4A, first, an anti-ferromagnetic layer 42 formed of, for example, Mn—Ir, a magnetic layer 43 formed of, for example, Co, a non-magnetic metal layer 44 formed of, for example, Cu, and a free magnetic layer 45 formed of, for example, Ni—Fe are stacked in this order on a substrate 41. Then, electrodes 46 sandwich the above formed stacked layers, and a current flows into the layers. In the vertical type GMR element, as shown in FIG. 4B, in the above formed stacked layers, one of the electrodes 46 is disposed on the free magnetic layer 45, and the other of the electrodes 46 is disposed on the sides of the anti-ferromagnetic layer 42 and the magnetic layer 43 so that a current vertically flows into the layers.

Next, a manufacturing method of the magnetoresistance effect elements in the magnetic sensor 1 according to the first embodiment of the present invention is described.

FIG. 5 is a flowchart showing processes to manufacture the magnetoresistance effect elements. In FIG. 5, the slant surfaces have been formed on a substrate of the magnetoresistance effect elements in the magnetic sensor 1.

First, on the slant surfaces of the substrate, layers having a designated layer structure are formed of which layers the magnetoresistance effect elements 2A through 2D are formed (S101). As the layers, the layers shown in FIG. 3, FIG. 4A, or FIG. 4B can be used. The magnetization fixing layer 34 (PIN layer) is formed by a thin film. Next, a pattern is formed in the formed layers by applying photolithography, and resist applied at the time of applying photolithography is removed (S102). Next, a protection layer is formed on the patterned layers (S103). With this, the patterned layers become elements.

Next, annealing is applied to the substrate including the elements in a magnetic field (S104). At this time, the magnetic field applying direction is not perpendicular to the slant surfaces of the substrate. Since the elements are gradually cooled by the annealing, the magnetization direction of the PIN layer 34 is determined by the temperature change (S105).

Next, annealing is again applied to the substrate including the elements in a magnetic field after determining the magnetization direction of the PIN layer 34 (S106). At this time, the magnetic field applying direction is parallel to the surface of the substrate. Since the elements are gradually cooled by the annealing, the magnetization easy direction of the soft layer 36 is determined by the temperature change (S107). At this time, since the magnetization direction of the PIN layer 34 has been determined in step S105, the magnetization direction of the PIN layer 34 is not changed.

Second Embodiment

Next, a second embodiment of the present invention is described.

A member having a high magnetic coercive force, for example, a permanent magnet thin film can be used for the magnetoresistance effect element.

Figure 6:
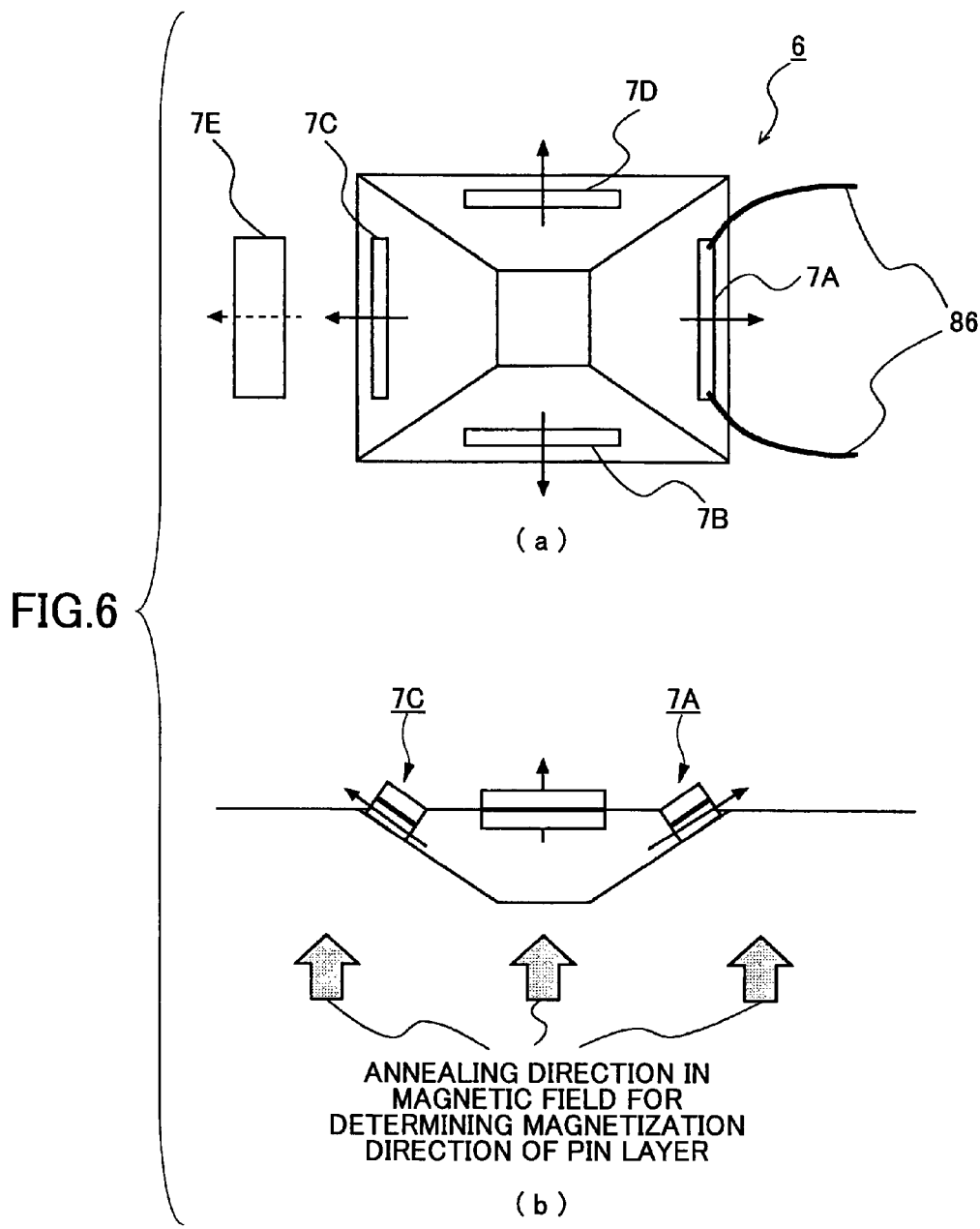
FIG. 6 is a diagram showing magnetoresistance effect elements in a magnetic sensor according to a second embodiment of the present invention.

FIG. 6 is a diagram showing magnetoresistance effect elements in a magnetic sensor according to a second embodiment of the present invention. In FIG. 6, (a) shows a plan view and (b) shows a side view. In FIG. 6(*b*), the elements are enlarged.

In the second embodiment of the present invention, in a magnetic sensor 6, a GMR element is used for each of magnetoresistance effect elements 7A through 7D. The GMR element uses a permanent magnetic member. A magnetoresistance effect element 7E is a conventional element and is used in a next process; however, the next process is omitted. That is, in the second embodiment of the present invention, the magnetoresistance effect element 2E is not used. The GMR element has electrodes one each at the end, and a current flows into layers of the GMR element by the electrodes. That is, the normal type GMR element is used. As shown in FIG. 6(*a*), the GMR element 7A has electrode thin film sections (electrodes) 86. Each of the GMR elements 7B through 7D has the electrodes 86; however, those are not shown in FIG. 6(*a*).

In the second embodiment of the present invention, instead of using the PIN layer 22 shown in FIG. 1, a permanent magnet layer is used. A magnetization fixing layer can be formed of the permanent magnet layer.

Figure 7:
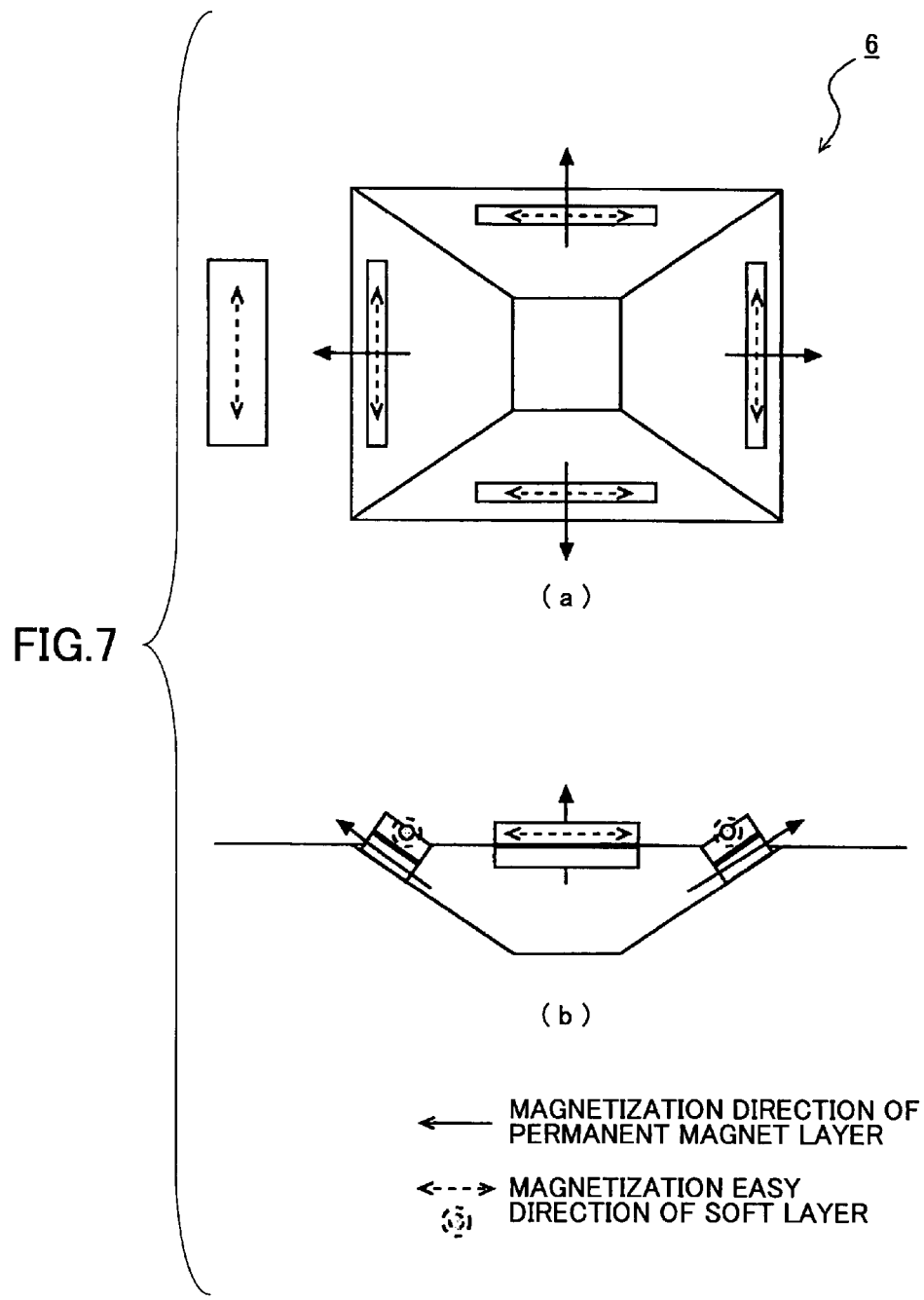
FIG. 7 is a diagram showing the magnetic sensor shown in FIG. 6 in which a magnetization direction of a permanent magnet layer and a magnetization easy direction of a soft layer are shown.

FIG. 7 is a diagram showing the magnetic sensor 6 shown in FIG. 6 in which the magnetization direction of the permanent magnet layer (PIN layer) and the magnetization easy direction of a soft layer are shown. In FIG. 7, (a) shows a plan view and (b) shows a side view. In FIG. 7(b), the size of each element is enlarged.

As shown in FIG. 7, the magnetization direction of the permanent magnet layer and the magnetization easy direction of the soft layer can be easily determined. The magnetization fixing layer can be formed of a relatively high magnetic coercive force member made of, for example, Co—Fe, instead of using the permanent magnet layer. In FIG. 7, the continuous arrow line shows the magnetization direction of the permanent magnet layer and the broken arrow line shows the magnetization easy direction of the soft layer.

In the second embodiment of the present invention, the structure of each of the GMR elements 7A through 7D is the same; therefore, the structure of the GMR element 7A is described as the representative.

Figure 8:
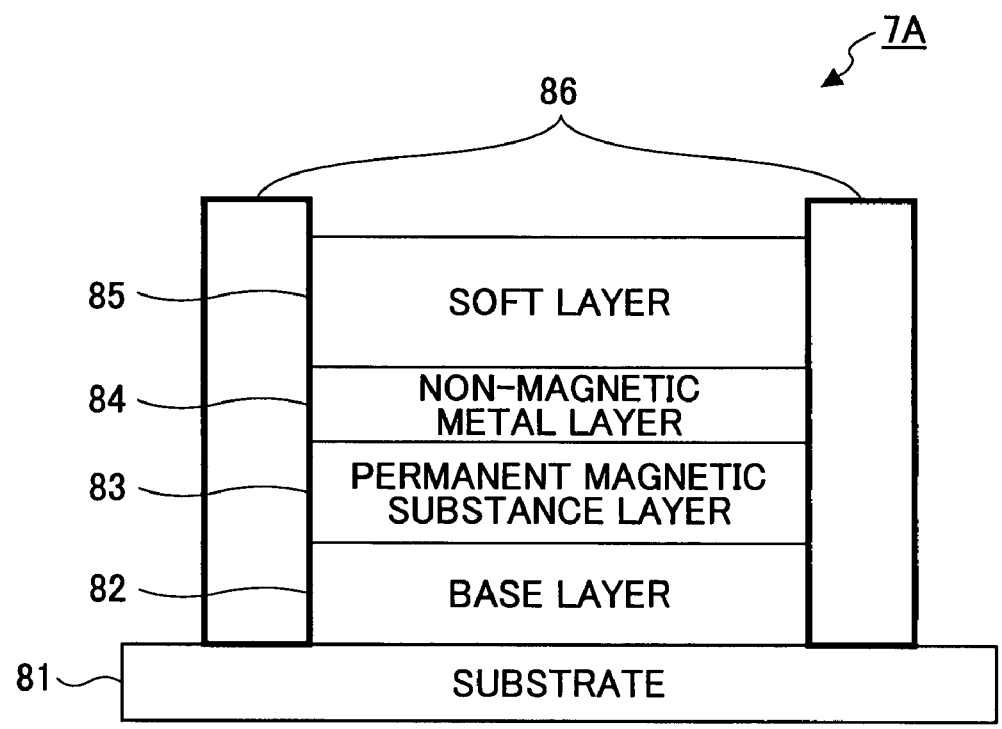
FIG. 8 is a diagram showing a structure of the magnetoresistance effect element shown in FIG. 6.

FIG. 8 is a diagram showing a structure of the magnetoresistance effect element 7A. In FIG. 8, the magnetoresistance effect element 7A is a horizontal type GMR element.

In the horizontal type GMR element 7A, a base layer 82 formed of, for example, Ta, and a permanent magnetic substance layer 83 are stacked on a substrate 81 in this order. The permanent magnetic substance used for the permanent magnetic substance layer 83 is a thin film formed of, for example, Pt—Fe, a ferrite magnet formed of Ba ferrite, a Sm—Co magnet, or a neodymium magnet. Further, a non-magnetic metal layer 84 formed of a non-magnetic substance, for example, Cu or Al, and a soft layer 85 formed of, for example, Fe—Co are stacked on the permanent magnetic substance layer 83 in this order. In addition, the electrode thin film sections (electrodes) 86 are disposed one at each side of the above layers.

In the GMR element 7A, since the flowing amount of electrons is changed by the magnetized state of the soft layer 85, the magnetic field change of the soft layer 85 is detected. Similar to the first embodiment of the present invention, in the second embodiment of the present invention, the GMR elements 7A through 7D are formed on the corresponding slant surfaces of the substrate 81. Therefore, the effective magnetic field intensity is increased for the film surface of the magnetic sensor 6, and the magnetic sensor 6 detects the magnetic field.

The magnetoresistance effect element 7A shown in FIG. 6 is not limited to the horizontal type GMR element shown in FIG. 8. The magnetoresistance effect elements 7A can be a vertical type TMR element or a vertical type GMR element.

Figure 9A:
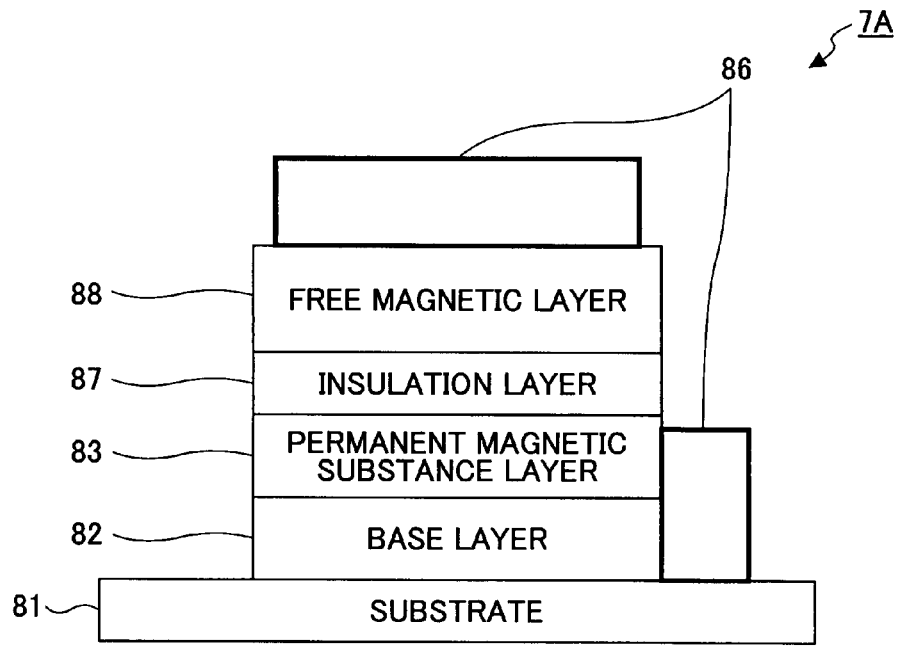
FIG. 9A is a diagram showing another structure of the magnetoresistance effect element shown in FIG. 6.
Figure 9B:
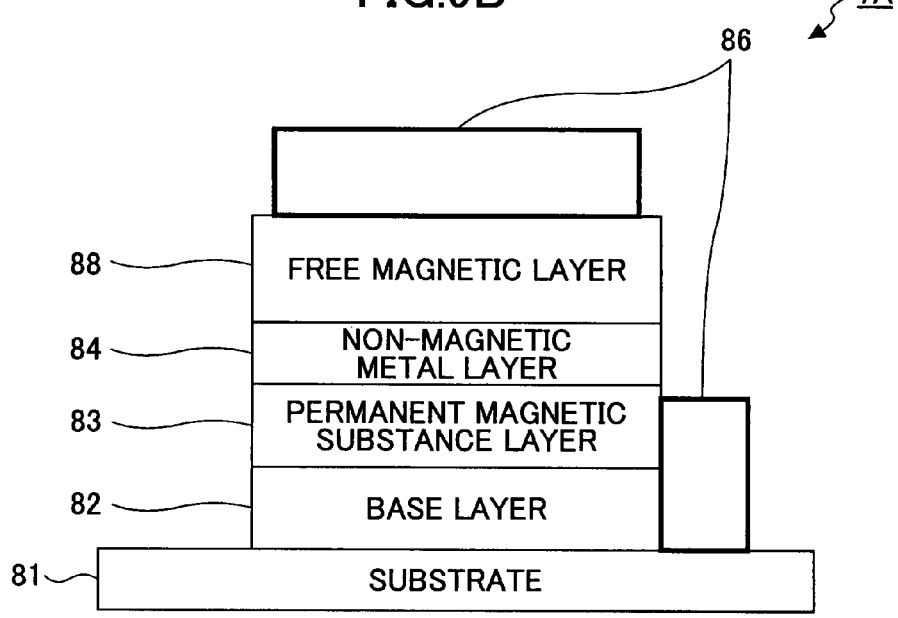
FIG. 9B is a diagram showing another structure of the magnetoresistance effect element shown in FIG. 6.

FIG. 9A is a diagram showing another structure of the magnetoresistance effect element 7A. In FIG. 9A, the magnetoresistance effect element 7A is a vertical type TMR element. FIG. 9B is a diagram showing another structure of the magnetoresistance effect element 7A. In FIG. 9B, the magnetoresistance effect element 7A is a vertical type GMR element.

In the vertical type TMR element 7A shown in FIG. 9A, the base layer 82 formed of, for example, Ta, and the permanent magnetic substance layer 83 are stacked on the substrate 81 in this order. Further, an insulation layer 87 formed of an insulation substance, for example, SiO$_2$, and a free magnetic layer 88 formed of, for example, Ni—Fe are stacked on the permanent magnetic substance layer 83 in this order. In addition, one of the electrodes 86 is disposed on the free magnetic layer 88, and the other thereof is disposed on the sides of the base layer 82 and the permanent magnetic substance layer 83.

In the vertical type GMR element 7A shown in FIG. 9B, the insulation layer 87 in the vertical type TMR element 7A shown in FIG. 9A is replaced by the non-magnetic metal layer 84 using a non-magnetic metal such as Cu and Al.

When the temperature is raised to approximately Curie temperature, the magnetic coercive force of the permanent magnetic substance layer 83 can be lowered. In this case, the magnetization amount and the magnetization direction of the permanent magnetic substance layer 83 which is used as the PIN layer can be arbitrarily determined. In addition, when a substance whose Curie temperature is different from that of the permanent magnetic substance layer 83 is disposed near the permanent magnetic substance layer 83, the magnetization direction of the permanent magnetic substance layer 83 can be determined. That is, the magnetization direction of the PIN layer can be determined.

The magnetic coercive force of the permanent magnetic substance layer 83 is sufficiently high and has a thin filmed-shape in which magnetization reversal hardly occurs due to an external magnetic field. Therefore, the magnetization direction of the permanent magnetic substance layer 83 can be one direction for a long time.

On the other hand, the magnetization easy direction of the non-magnetic metal layer 84 (soft layer) is determined to be approximately 90° from the magnetization direction of the permanentmagnetic substance layer 83. Therefore, the magnetic sensor 6 can be realized which sensor has a linear detecting characteristic capable of detecting from a low magnetic force of terrestrial magnetism to some 10 Oe which is detected by a general-purpose magnetic sensor.

In addition, a magnetic field is applied when the layers of the magnetoresistance effect elements 7A through 7D are formed then annealing is applied to the magnetoresistance effect elements 7A and 7D, and the magnetization is determined by the direction of the applied magnetization field. At this time, when temperature conditions and the direction of the magnetic field are determined, the magnetization can be obtained in plural desired directions.

Next, a manufacturing method of the magnetoresistance effect elements in the magnetic sensor 6 according to the second embodiment of the present invention is described.

Figure 10:
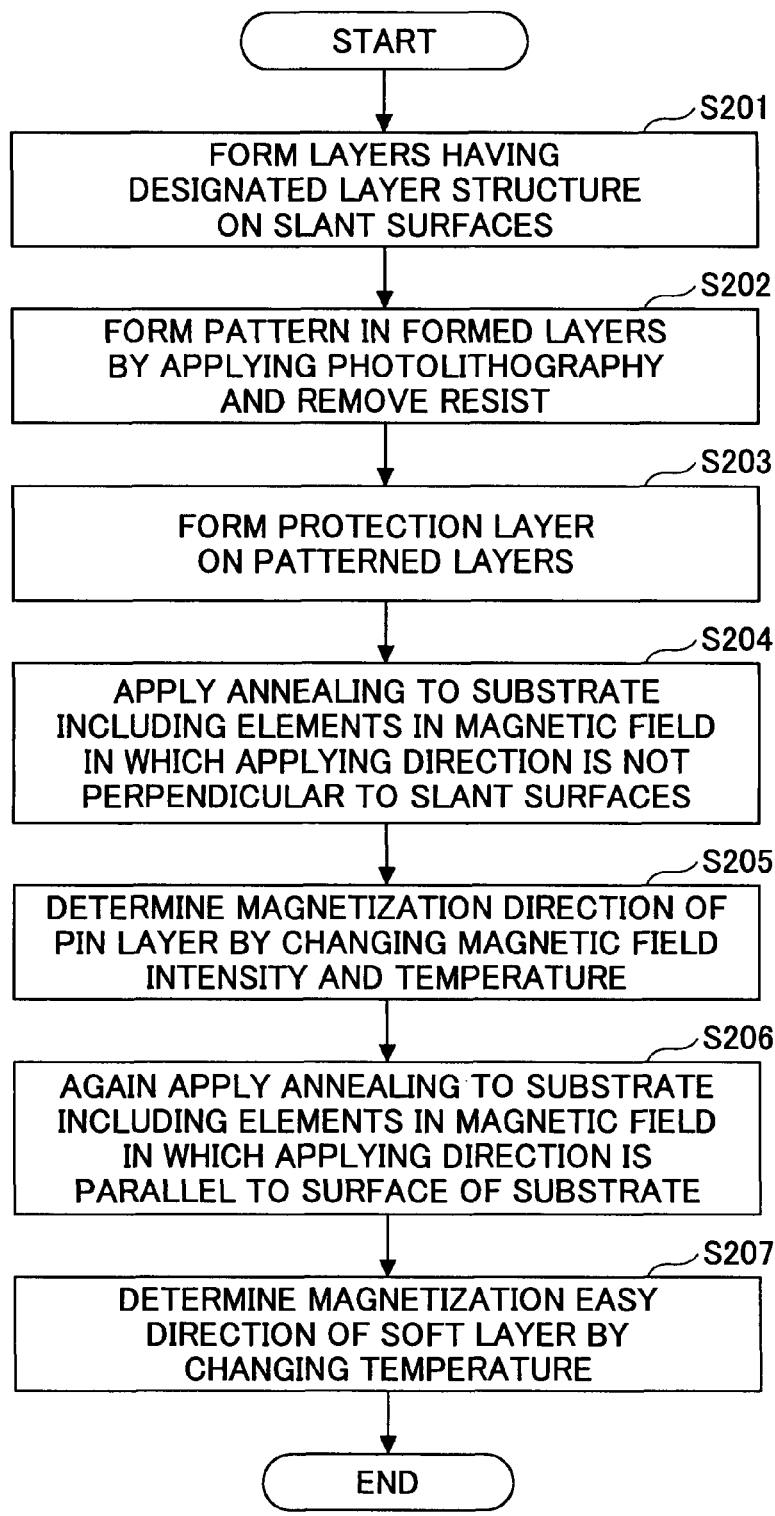
FIG. 10 is a flowchart showing processes to manufacture the magnetoresistance effect elements shown in FIG. 6.

FIG. 10 is a flowchart showing processes to manufacture the magnetoresistance effect elements in the magnetic sensor 6. In FIG. 10, the slant surfaces have been formed on a substrate of the magnetoresistance effect elements in the magnetic sensor 6.

First, on the slant surfaces of the substrate, layers having a designated layer structure are formed of which layers the magnetoresistance effect elements 7A through 7D are formed (S201). As the layers, the layers shown in FIG. 8, 9A, or 9B can be used. Next, a pattern is formed in the formed layers by applying photolithography, and resist applied at the time of applying photolithography is removed (S202). Next, a protection layer is formed on the patterned layers (S203). With this, the patterned layers become elements.

Next, annealing is applied to the substrate including the elements in a magnetic field (S204). At this time, the magnetic field applying direction is not perpendicular to the slant surfaces of the substrate. Since the magnetic field intensity is changed by lowering the temperature to near Curie temperature and the temperature is changed by annealing the substrate including the elements, the elements are gradually cooled. With this, the magnetization direction of the permanent magnetic substance layer 83 (PIN layer) is determined (S205).

Next, annealing is again applied to the substrate including the elements in a magnetic field after determining the magnetization direction of the PIN layer (S206). At this time, the magnetic field applying direction is parallel to the surface of the substrate. Since the elements are gradually cooled by the annealing, the magnetization easy direction of the soft layer (the soft layer 85, or the non-magnetic metal layer 84) is determined by the temperature change (S207). At this time, since the magnetization direction of the PIN layer has been determined in step S205, the magnetization direction of the PIN layer is not changed.

Returning to the first embodiment of the present invention, a magnetic field generating member (auxiliary magnetic field generating unit) is described. The magnetic field generating member can be disposed near the elements as a magnetic field generating guide so as to fix the magnetization direction of the magnetization fixing layer.

Figure 11:
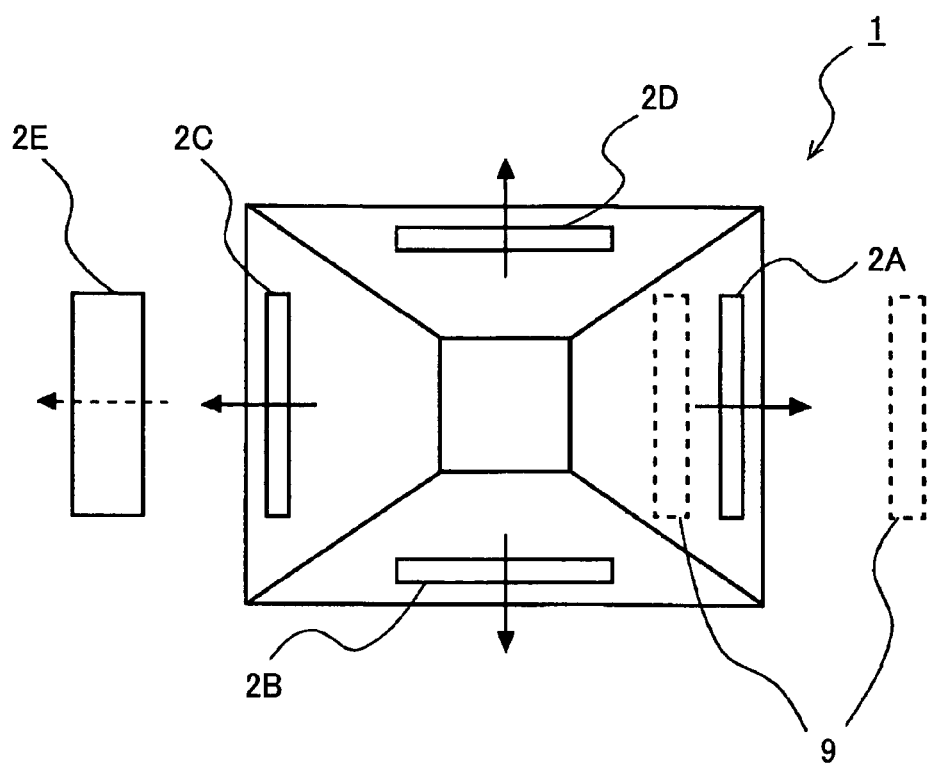
FIG. 11 is a diagram showing the magnetic sensor in which a magnetic field generating member is disposed near the magnetoresistance effect element shown in FIG. 1.

FIG. 11 is a diagram showing the magnetic sensor 1 in which a magnetic field generating member 9 (auxiliary magnetic field generating unit) is disposed near the magnetoresistance effect element 2A. In FIG. 11, only one magnetic field generating member 9 is shown; however, actually, the magnetic field generating member 9 can also be disposed near each of the magnetoresistance effect elements 2B through 2D.

At this time, the magnetization direction can be determined by applying a magnetic field from the outside while connecting magnetic field applying wirings to the magnetic field generating member 9. In addition, the magnetization direction of the PIN layer can be fixed by applying heat to the elements in a vacuum. Moreover, a jig is formed of a permanent magnetic substance which can apply a magnetic field in multi-axis directions, and the jig is disposed near each element; with this, a desired minute magnetization region can be formed in the film surface of the layer.

In addition, when heat is applied to the magnetoresistance effect elements in a vacuum, a laser can be used as the heat source. The following magnetic field applying methods can be used. That is, a magnetic field is applied in plural directions by changing time, a magnetic field is applied to a magnetoresistance effect element when the magnetoresistance effect element is heated by a laser while uniformly applying the magnetic field in plural directions, and a non-uniform magnetic field is simultaneously applied to the magnetoresistance effect elements.

In addition, in order to absorb the heat from the heat source, a member with large heat capacity and low heat conductivity can be disposed near the magnetoresistance effect element. As the heating method, there are a method in which heat is applied from the outside and a method in which a heating member is disposed near the magnetoresistance effect element. In a vacuum, in addition to applying heat, the magnetization direction of the PIN layer can be fully fixed by gradually cooling the magnetoresistance effect element after instantaneously heating the magnetoresistance effect element without oxidizing the magnetoresistance effect element. However, actually, the desired magnetization can be executed at atmospheric pressure or pressure slightly reduced from the atmospheric pressure.

In addition, a magnetic field is applied in a desired direction from the outside when the temperature is raised at the position of the magnetoresistance effect element, and the magnetization direction can be freely determined in the position of the magnetoresistance effect element. As described above, when a jig is formed of a permanent magnetic substance which can apply a magnetic field in multi-axis directions and the jig is disposed near each magnetoresistance effect element, a desiring minute magnetization region can be formed in the film surface of the layer. In this case, process time can be sufficiently reduced.

Figure 12:
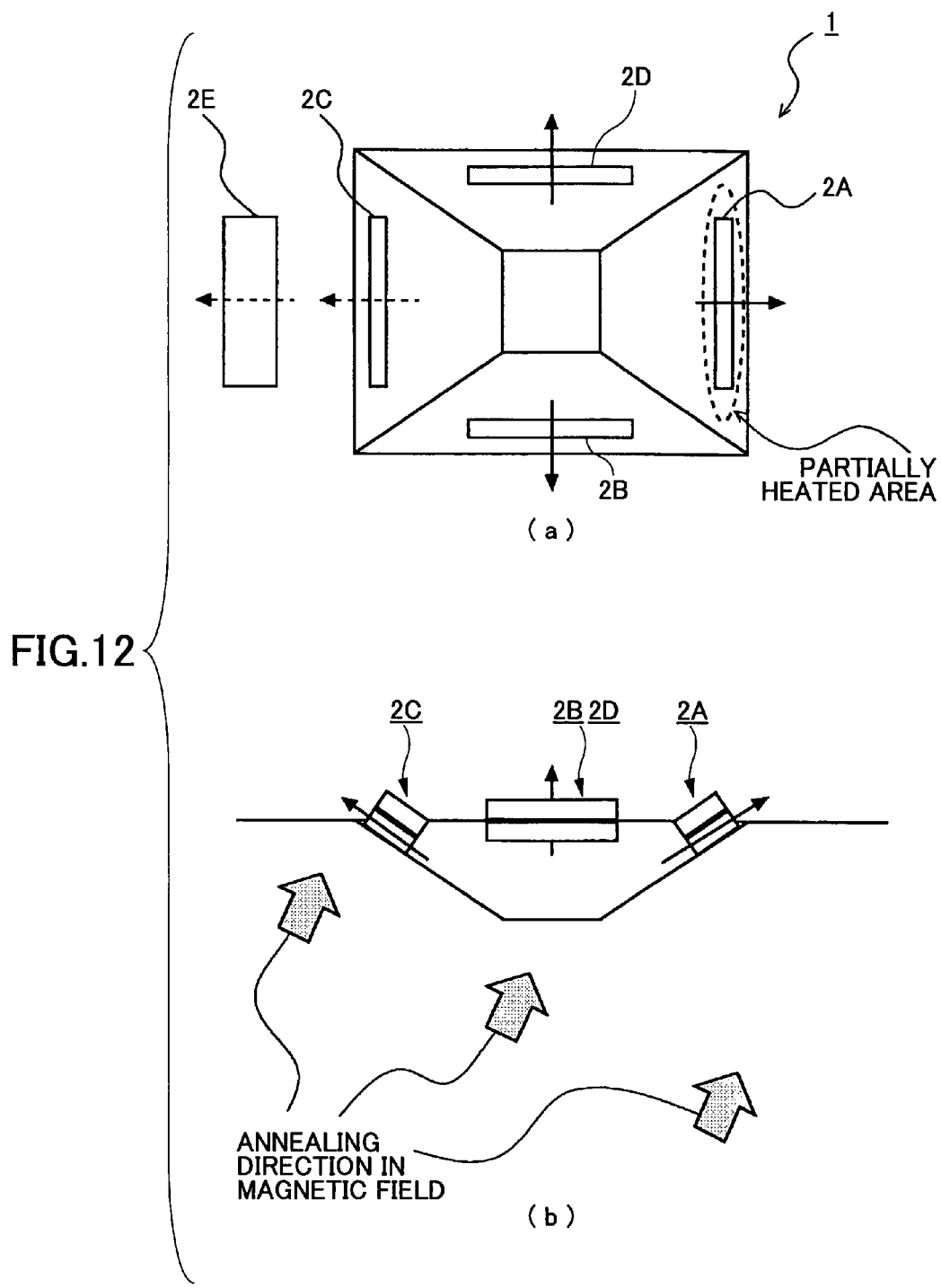
FIG. 12 is a diagram showing the magnetic sensor in which an area surrounding the magnetoresistance effect element shown in FIG. 1 is partially heated.

FIG. 12 is a diagram showing the magnetic sensor 1 in which an area surrounding the magnetoresistance effect element 2A is partially heated. In FIG. 12, (a) shows a plan view and (b) shows a side view in which the size of each of the magnetoresistance effect elements 2A through 2D is enlarged. As described above, In FIG. 12(*a*), the area surrounding the magnetoresistance effect element 2A is partially heated; however, since the magnetization direction of the PIN layer of the magnetoresistance effect element 2C has been determined beforehand, heat is not applied to the magnetoresistance effect element 2C.

As described above, since the magnetoresistance effect element 2A is heated in a pinpoint manner, the magnetization direction of the magnetoresistance effect element 2A can be determined by arranging an external magnetic field in a desired direction. On the other hand, since the magnetization direction of the PIN layer of the magnetoresistance effect element 2C has been determined beforehand and heat is not applied thereto, the magnetization direction of the magnetoresistance effect element 2C is not changed.

As described above, since the direction of the external magnetic field for determining the magnetization direction is arranged in the desired direction, the magnetization direction can be easily determined. In addition, since effective magnetic field intensity can be increased in a pinpoint manner, a magnetic field generating device can be miniaturized.

In the present embodiment, a magnetoresistance effect element to be formed can have a slant surface beforehand. In this case, since the magnetoresistance effect element has the slant surface, the magnetic sensor 1 can detect magnetism in multi-axis directions and the detecting fineness can be further minute. In this case, the annealing direction in the magnetic field has an angle from the surface direction of the magnetic sensor to be formed, and is separated from the direction of the magnetic field.

In this case, after forming the anti-ferromagnetic layer 32 (42), a slant surface is formed by applying photolithography. Then, annealing is performed by removing resist applied at the time when the photolithography is applied. The annealing in the magnetic field is effective for the PIN layer even before removing the resist; further, the annealing is effective for the soft layer when the preciseness is not needed.

Then, a PIN layer is formed by stacking a magnetic layer 33 formed of, for example, Co—Fe on the anti-ferromagnetic layer 32. In the PIN layer whose magnetization direction is one axis formed by the above method, the PIN layer can fix the magnetization direction by receiving a magnetization amount of a part projected at the boundary surface of the PIN layer. That is, the PIN layer has a spin-valve structure and the magnetization direction of the PIN layer is fixed by being applied an exchange-coupled magnetic field on the boundary surface between the magnetic layer 33 and the anti-ferromagnetic layer 32.

At this time, a guiding effect of an external magnetic field can be utilized in which magnetic flux is likely to transmit in a magnetic thin film.

In the manufacturing method after the above, a TMR element of a spin-valve structure described above can be formed.

In the first and second embodiments of the present invention, the protection layer can be formed of an organic material of polyimide or an inorganic material such as $SiO_2$ and $Si_3N_4$.

In addition, in a magnetoresistance effect element, for example, after forming a base part of an anti-ferromagnetic substance into a mesa shape, an anti-ferromagnetic thin film is formed on the mesa-shaped part, and further, a ferromagnetic thin film is formed thereon. After forming the above stacked structure, a spin-valve type TMR element or a spin-valve type GMR element can be formed.

Third Embodiment

Next, a third embodiment of the present invention is described.

Figure 13:
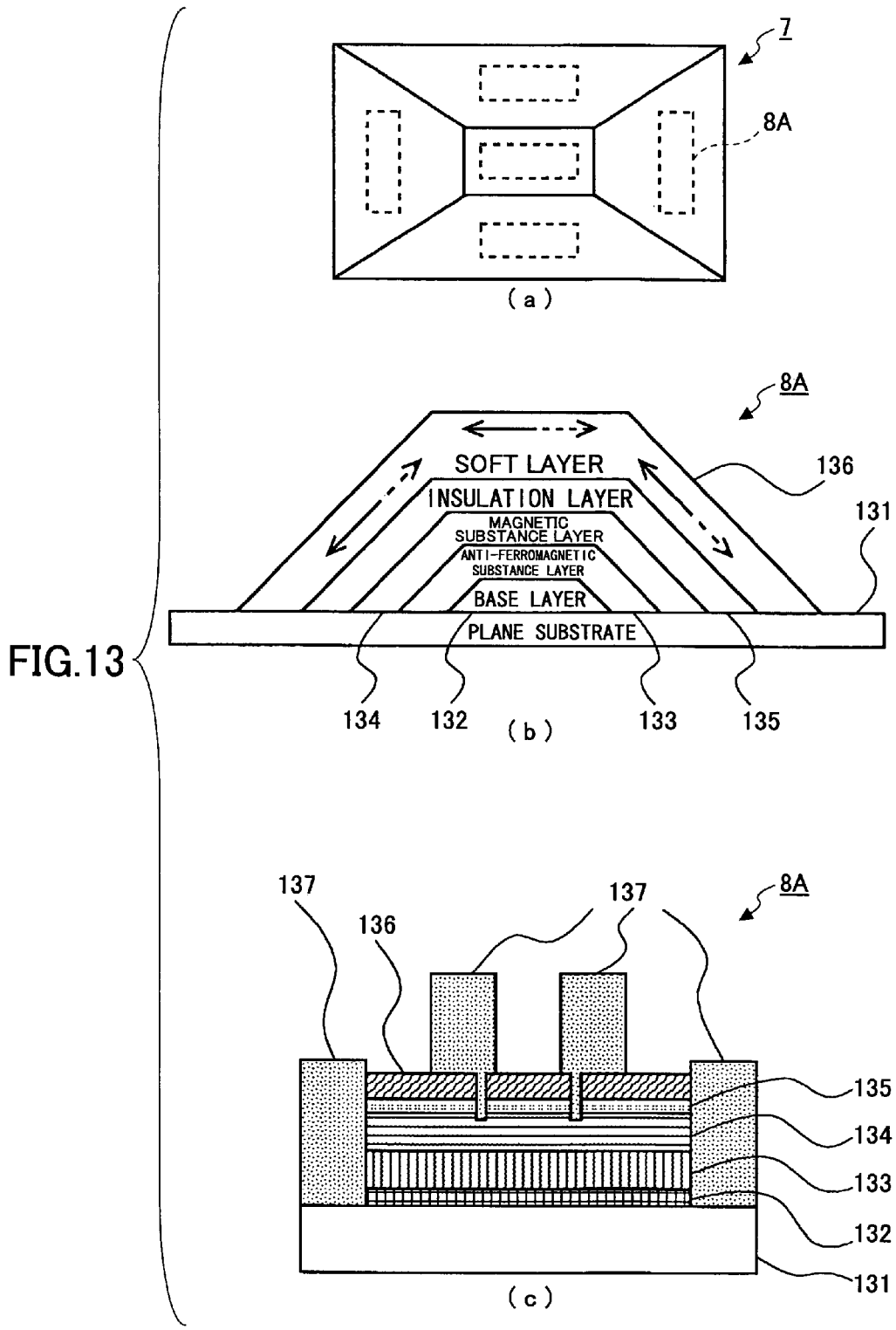
FIG. 13 is a diagram showing a magnetoresistance effect element in a magnetic sensor according to a third embodiment of the present invention.

FIG. 13 is a diagram showing a magnetoresistance effect element in a magnetic sensor according to a third embodiment of the present invention. In FIG. 13, (a) shows a plan view of a magnetic sensor 7, (b) shows a side view of a magnetoresistance effect element 8A in which the size thereof is enlarged, and (c) shows a cut-away side view of the magnetoresistance effect element 8A in which the size thereof is enlarged. As shown in FIG. 13(b), the magnetoresistance effect element 8A has a slant surface. In FIG. 13(a), the magnetic sensor 7 includes plural magnetoresistance effect elements; however, only the magnetoresistance effect element 8A is shown.

In the magnetoresistance effect element 8A shown in FIGS. 13(b) and (c), a base layer 132 is formed on a plane substrate 131. The base layer 132 is formed into a mesa shape, and an anti-ferromagnetic substance layer 133, a magnetic substance layer 134, an insulation layer 135, and a soft layer 136 are stacked on the mesa-shaped base layer 132 in this order. With this, a TMR element is formed. Then, a protection layer 137 is formed on the above formed element by removing resist after applying photolithography. With this, as shown in FIG. 13(c), the TMR element is formed. In FIG. 13(c), the slant surface of the TMR element is omitted.

In the above, instead of forming the base layer 132 into the mesa shape, the anti-ferromagnetic substance layer 133 can be formed into a mesa shape or a PIN layer (the anti-ferromagnetic substance layer 133 and the magnetic substance layer 134) can be formed into a mesa shape. Further, without forming a mesa shape in the above layers, a slant surface can be formed in the soft layer 136.

Next, a manufacturing method of the magnetoresistance effect elements shown in FIG. 13 is described.

Figure 14:
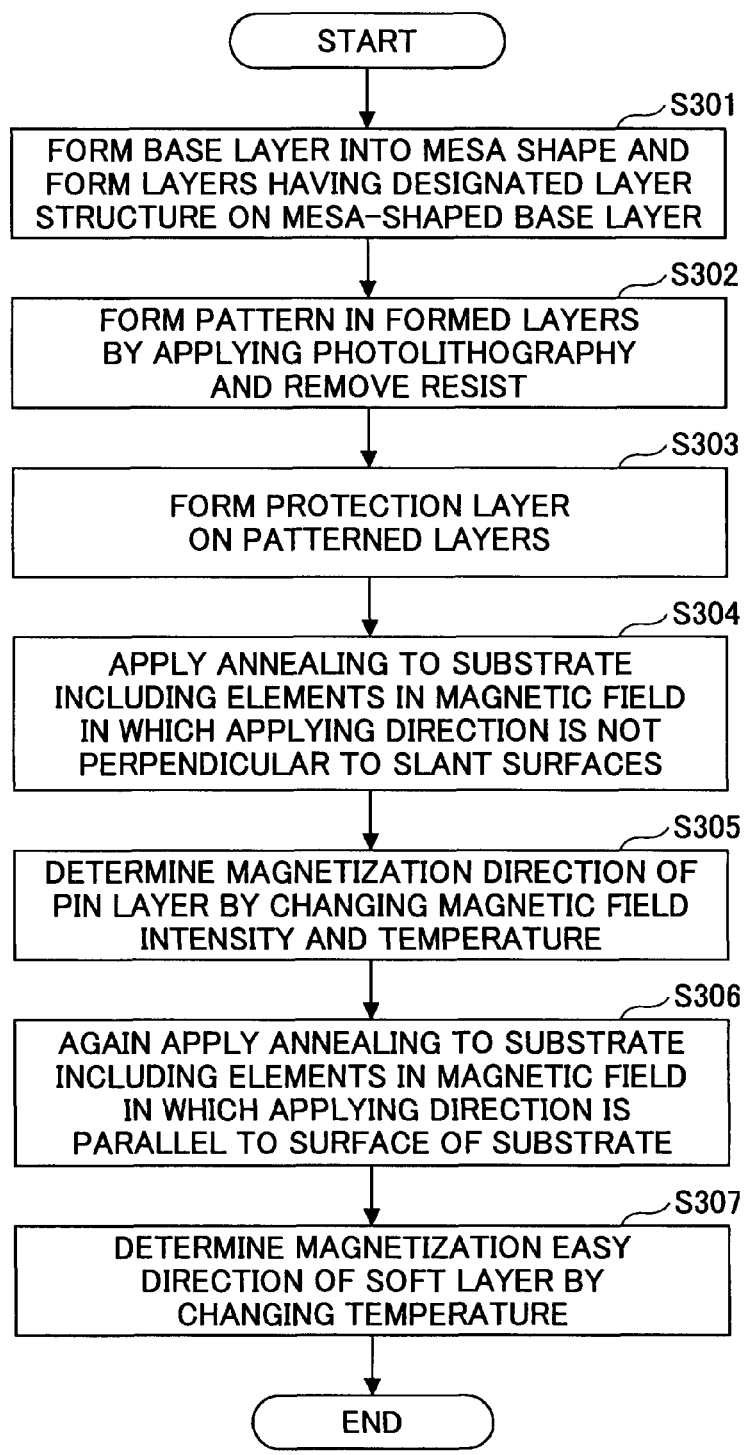
FIG. 14 is a flowchart showing processes to manufacture mesa-shaped magnetoresistance effect elements shown in FIG. 13.

FIG. 14 is a flowchart showing processes to manufacture mesa-shaped magnetoresistance effect elements.

First, a base layer 132 is formed on a plane substrate 131. The base layer 132 is formed into a mesa shape, and desired layers (an anti-ferromagnetic substance layer 133, a magnetic substance layer 134, an insulation layer 135, and a soft layer 136) are stacked on the mesa-shaped base layer 132 in this order (S301). Next, a pattern is formed in the formed layers by applying photolithography and resist applied at the time of applying the photolithography is removed (S302). Next, a protection layer is formed on the patterned layers (S303). With this, the patterned layers become elements.

Next, annealing is applied to the plane substrate 131 including the elements in a magnetic field (S304). At this time, the magnetic field applying direction is not perpendicular to the slant surfaces of the elements. Since the magnetic field intensity is changed by lowering the temperature to near Curie temperature and the temperature is changed by annealing the plane substrate 131 including the elements, the elements are gradually cooled. With this, the magnetization direction of a PIN layer (the anti-ferromagnetic substance layer 133 and the magnetic substance layer 134) is determined (S305).

Next, annealing is again applied to the plane substrate 131 including the elements in a magnetic field after determining the magnetization direction of the PIN layer (S306). At this time, the magnetic field applying direction is parallel to the surface of the plane substrate 131. Since the elements are gradually cooled by the annealing, the magnetization easy direction of the soft layer 136 is determined by the temperature change (S307). At this time, since the magnetization direction of the PIN layer has been determined in step S305, the magnetization direction of the PIN layer is not changed.

As described above, since the magnetoresistance effect elements are formed by the above processes, the magnetic sensor 7 can be miniaturized.

Fourth Embodiment

Figure 15:
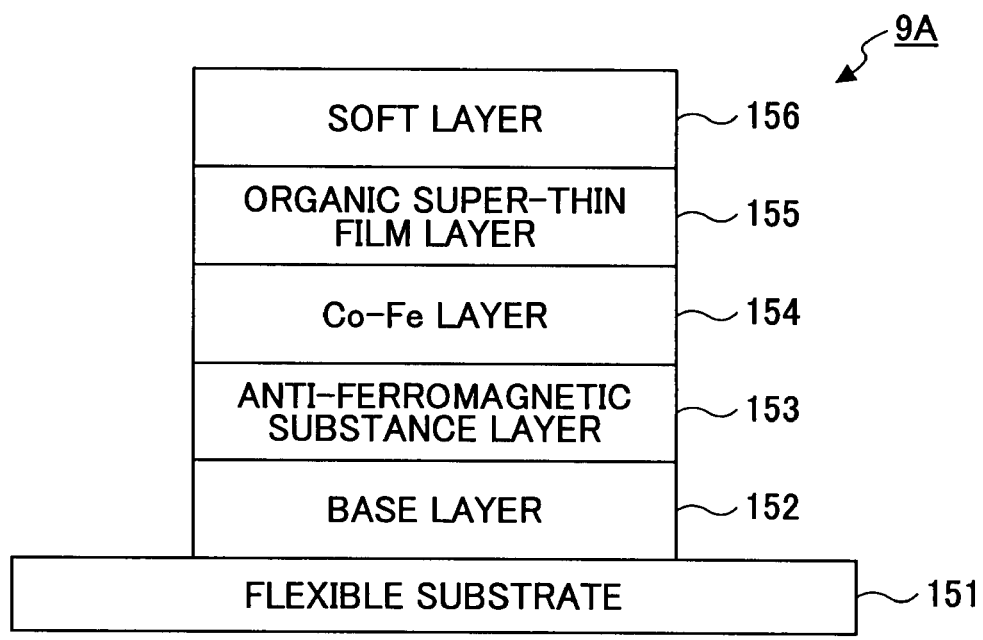
FIG. 15 is a diagram showing a structure of a magnetoresistance effect element according to a fourth embodiment of the present invention.
Figure 16A:
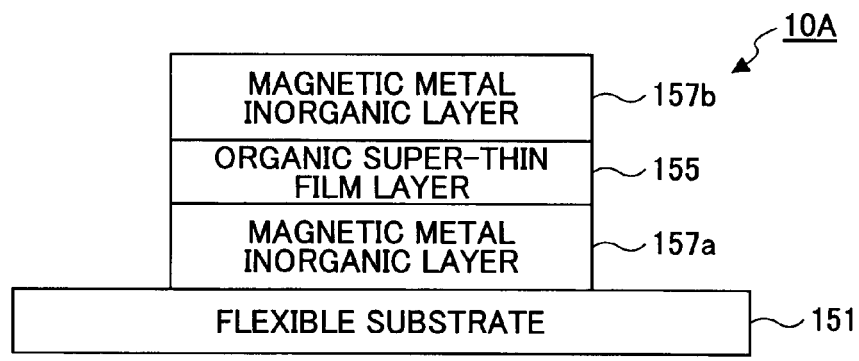
FIG. 16A is a diagram showing a structure of another magnetoresistance effect element according to the fourth embodiment of the present invention.
Figure 16B:
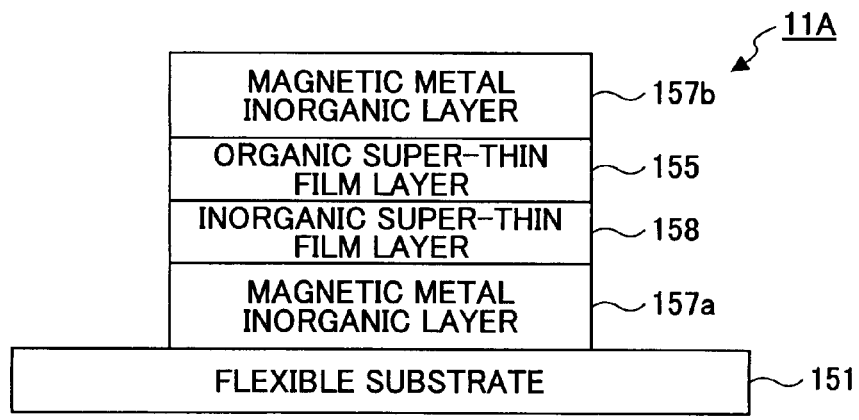
FIG. 16B is a diagram showing a structure of another magnetoresistance effect element according to the fourth embodiment of the present invention.

Next, a fourth embodiment of the present invention is described. In the fourth embodiment of the present invention, a flexible substrate is used for magnetoresistance effect elements. FIG. 15 is a diagram showing a structure of a magnetoresistance effect element 9A according to a fourth embodiment of the present invention. FIG. 16A is a diagram showing a structure of a magnetoresistance effect element 10A according to the fourth embodiment of the present invention. FIG. 16B is a diagram showing a structure of a magnetoresistance effect element 11A according to the fourth embodiment of the present invention. In FIGS. 15, 16A, and 16B, one magnetoresistance effect element is shown; however, plural magnetoresistance effect elements are disposed in a magnetic sensor.

As shown in FIG. 15, in the magnetoresistance effect element 9A, a base layer 152 formed of, for example, Ta; an anti-ferromagnetic substance layer 153 formed of, for example, Fe—Ni; a Co—Fe layer 154, an organic super-thin film layer 155, and a soft layer 156 are stacked on a slant surface of a flexible substrate 151 in this order.

As shown in FIG. 16A, in the magnetoresistance effect element 10A, a magnetic metal inorganic layer 157a, the organic super-thin film layer 155, and a magnetic metal inorganic layer 157b are stacked on the slant surface of the flexible substrate 151 in this order. In addition, as shown in FIG. 16B, in the magnetoresistance effect element 11A, the magnetic metal inorganic layer 157a, an inorganic super-thin film layer 158, the organic super-thin film layer 155, and the magnetic metal inorganic layer 157b are stacked on the slant surface of the flexible substrate 151 in this order.

As described above, according to the fourth embodiment of the present invention, a magnetoresistance effect element can be formed on a flexible substrate. In addition, instead of all the elements, a part of the magnetoresistance effect elements can be formed on a flexible substrate. With this, the movement of the flexible substrate can be detected. Since plural sensing axes can be determined in the magnetic sensor on the flexible substrate, the magnetic sensor can accurately detect a position. Therefore, the magnetic sensor on the flexible substrate can be applied to a moving member.

Effective Magnetic Field Intensity

Next, effective magnetic field intensity is described in detail.

Figure 17:
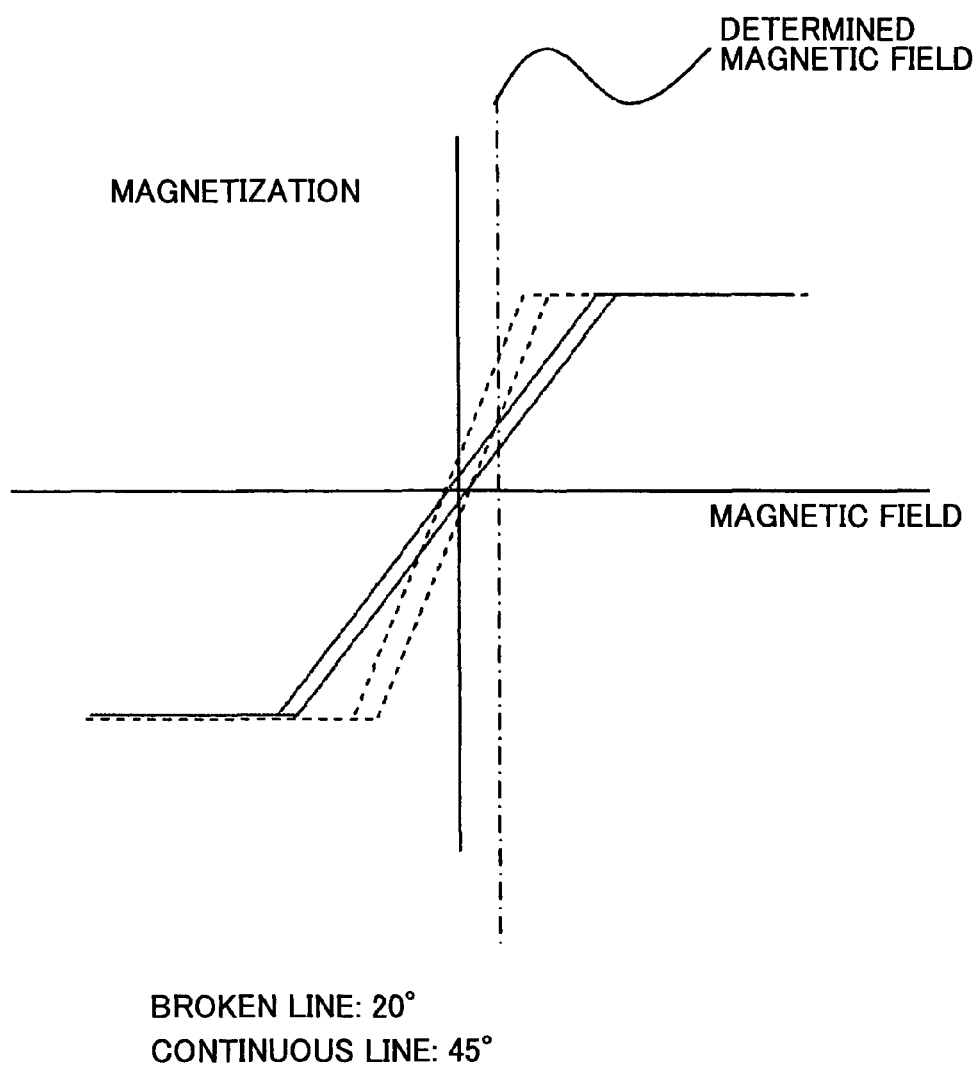
FIG. 17 is a graph showing a difference of the effective magnetic field intensity corresponding to an angular difference of a magnetic field being applied onto a film surface of the soft layer shown in FIG. 2.

FIG. 17 is a graph showing a difference of the effective magnetic field intensity corresponding to an angular difference of a magnetic field being applied onto the film surface of the soft layer 21 of the TMR element 2A. That is, magnetization hysteresis curves are shown. In FIG. 17, broken lines show an angle 20° between the film surface of the soft layer 21 and the applied magnetic field direction, and the continuous lines show an angle 45°.

As shown in FIG. 17, even if the same soft layer 21 is used, the magnetization hysteresis curve (MH curve) is different depending on the angle of the magnetic field applied. Since the effective magnetic field intensity can be changed by the magnetic field applied angle, the magnetic field can be determined to be on an alternate one-dot broken line shown in FIG. 17.

Figure 18:
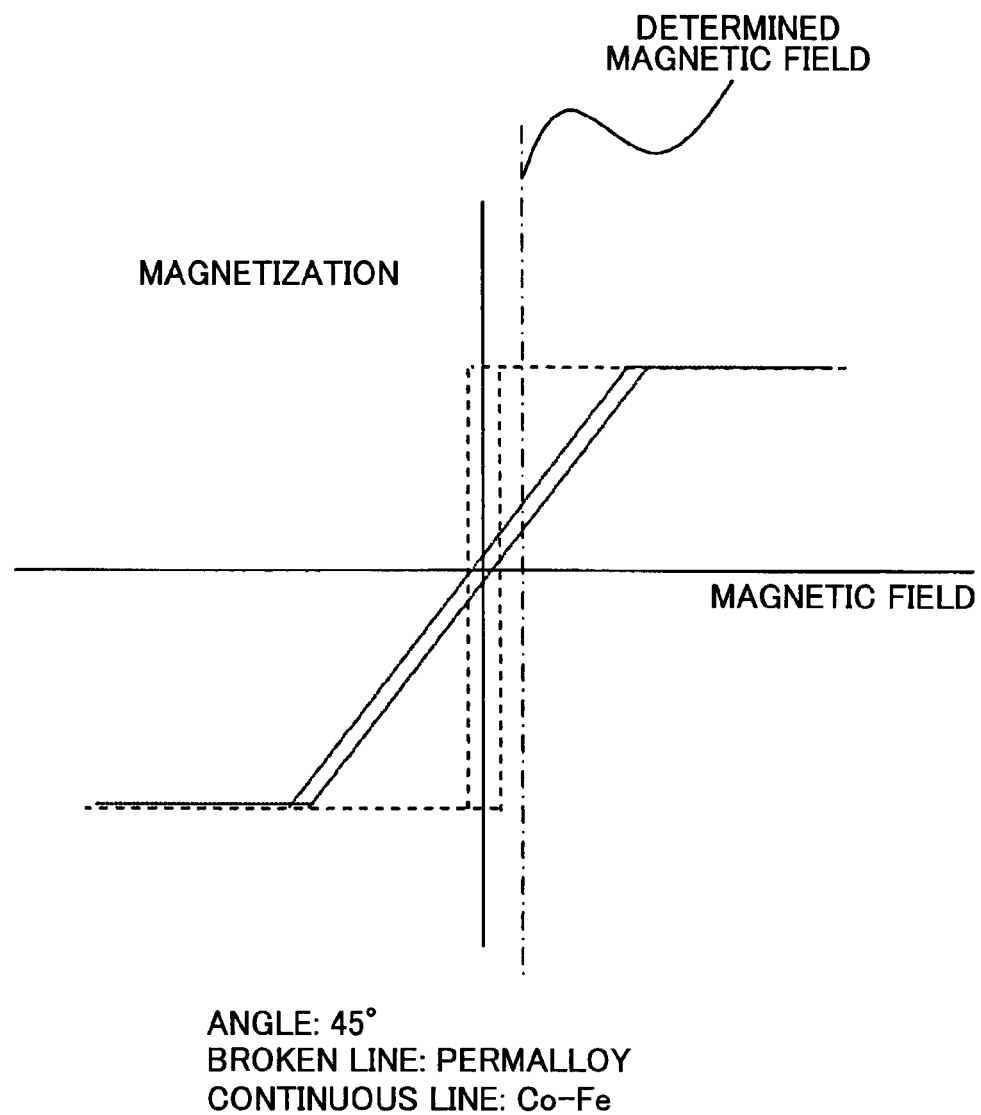
FIG. 18 is a graph showing a difference of the effective magnetic field intensity corresponding to a substance difference of the soft layer shown in FIG. 2.

FIG. 18 is a graph showing a difference of the effective magnetic field intensity corresponding to a substance difference of the soft layer 21. In FIG. 18, a magnetic field applied angle onto the film surface of the soft layer 21 of the TMR element 2A is 45°, and magnetization hysteresis curves are shown. In addition, broken lines show when the material of the soft layer 21 is permalloy, and the continuous lines show when the material is Co—Fe.

As shown in FIG. 18, when the material of the soft layer 21 is different, the MH curve is different depending on the material of the soft layer 21. Since the effective magnetic field can be changed by the material of the soft layer 21, the magnetic field can be determined to be on an alternate one-dot broken line shown in FIG. 18. In this case, the permalloy can saturate the magnetization.

Figure 19:
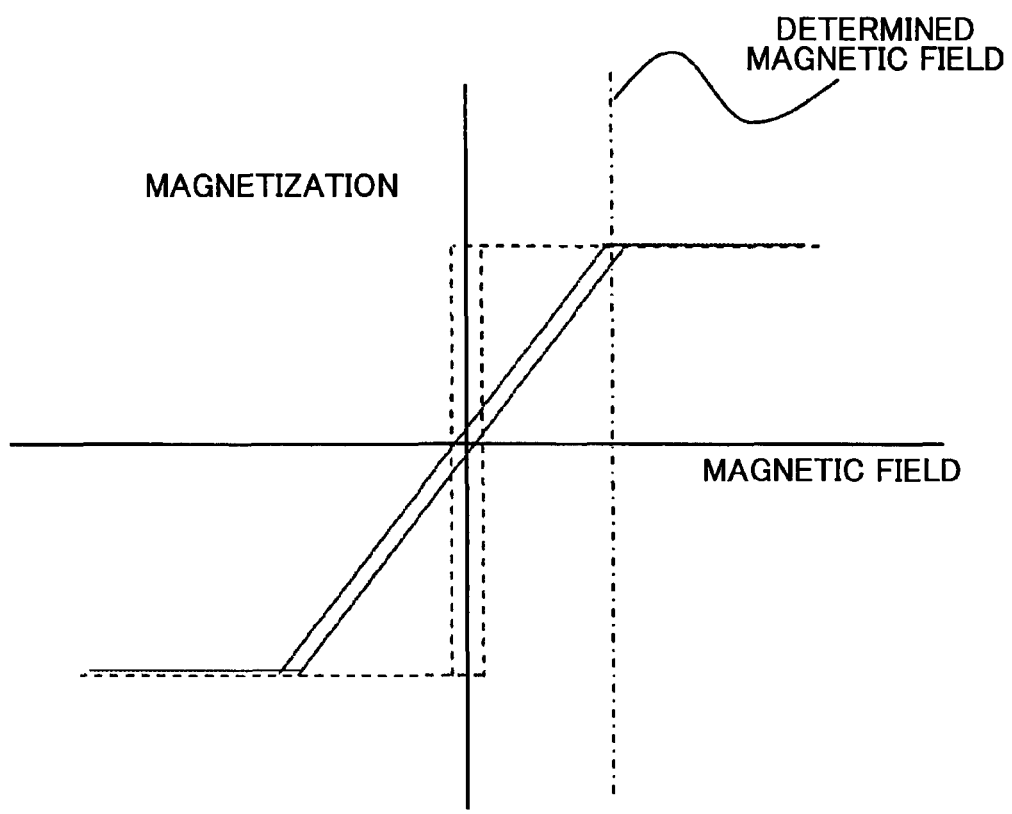
FIG. 19 is a modified graph of that shown in FIG. 18.

FIG. 19 is a modified graph of that shown in FIG. 18. That is, in FIG. 19, the magnetic field is determined to be on an alternate one-dot broken line. As shown in FIG. 19, in both the materials permalloy and Co—Fe, the magnetization is saturated at the determined magnetic field. However, the magnetization is not saturated at a different magnetic field applied angle, and magnetic flux is likely to flow at the different angle. Therefore, when the flow of the magnetic flux is desired to be changed, the magnetic field applied angle can be changed.

As described above, according to the embodiments of the present invention, by using the magnetoresistance effect elements, a small-sized and light-weight magnetic sensor having multi-axis direction detect-ability can be realized. In addition, plural magnetization directions can be formed in a magnetoresistance effect element, and the magnetic sensor can be further miniaturized. Further, since a flexible substrate can be used for the substrate of the magnetoresistance effect element, the magnetic sensor can be applied to biometrics.

In addition, the magnetoresistance effect element in the embodiments of the present invention can be used in a signal processing device.

Further, the present invention is not limited to the specifically disclosed embodiments, and variations and modifications may be made without departing from the scope of the present invention.

The present invention is based on Japanese Priority Patent Application No. 2006-057986, filed on Mar. 3, 2006, and Japanese Priority Patent Application No. 2006-058012, filed on Mar. 3, 2006, with the Japanese Patent Office, the entire contents of which are hereby incorporated herein by reference.

What is claimed is:

1. A magnetic sensor, comprising:
a first magnetoresistance effect element, including a soft layer whose magnetization easy direction is changed by a direction of an external magnetic field and a magnetization fixing layer whose magnetization direction is fixed by having a magnetic layer and an anti-ferromagnetic layer, and wherein a magnetoresistance effect of said magnetoresistance effect element is generated by a change of electric conduction which is caused by a relative angle between the magnetization easy direction of the soft layer and the magnetization direction of the magnetization fixing layer, and wherein said magnetization fixing layer has a film surface, and wherein said film surface is not perpendicular to a magnetizing direction; and a second magnetoresistance effect element, including a soft layer whose magnetization easy direction is changed by a direction of an external magnetic field, and a magnetization fixing layer whose magnetization direction is fixed by having a magnetic layer and an anti-ferromagnetic layer, and wherein a magnetoresistance effect of said second magnetoresistance effect element is generated by a change of electric conduction which is caused by a relative angle between the magnetization easy direction of the soft layer of said second magnetoresistance effect element and the magnetization direction of the magnetization fixing layer of said second magnetoresistance effect element, and wherein said magnetization fixing layer of said second magnetoresistance effect element has a film surface, and wherein said film surface of said magnetization fixing layer of said second magnetoresistance effect element is not perpendicular to said magnetizing direction, and wherein said film surface of said magnetization fixing layer of said first magnetoresistance effect element and said film surface of said magnetization fixing layer of said second magnetoresistance effect element are not parallel to each other; and wherein the magnetic sensor has two-axis or more vectors of the magnetization directions, and wherein the magnetoresistance effect elements are adjacently disposed.

2. The magnetic sensor as claimed in claim 1, wherein the magnetization fixing layers are formed of a substance having a high magnetic coercive force.

3. The magnetic sensor as claimed in claim 1, wherein the magnetization fixing layer of the first element has a spin-valve structure in which the magnetization direction is fixed by an exchange-coupled magnetic field being applied on a boundary surface between the magnetic layer of the first element and the anti-ferromagnetic layer of the first element.

4. The magnetic sensor as claimed in claim 1, wherein the magnetization directions of the magnetization fixing layers are fixed by an external magnetic field after being heated by a heating unit of an external heat source.

5. The magnetic sensor as claimed in claim 4, wherein the magnetization fixing layers are formed of a plurality of materials and the magnetization directions of the magnetization fixing layer are determined by a Curie temperature of each material and the external magnetic field when the magnetoresistance effect elements are heated by the heating unit.

6. The magnetic sensor as claimed in claim 1, further comprising an auxiliary magnetic field generating unit disposed near the first magnetoresistance effect element so as to fix the magnetization direction of the magnetization fixing layer of the first element.

7. The magnetic sensor as claimed in claim 4, wherein the heating unit includes a specific region heating unit for heating a specific region and the magnetization fixing layer of the first element disposed at the specific region is heated by the specific region heating unit and the magnetization direction of the magnetization fixing layer of the first element is fixed.

8. The magnetic sensor as claimed in claim 4, further comprising a heat absorbing unit for absorbing heat from the external heat source.

9. The magnetic sensor as claimed in claim 1, wherein said sensor includes a substrate that has a pyramidal or conical shape, and wherein the anti-ferromagnetic layers have slant surfaces corresponding to said pyramidal or conical shape, and the magnetic layers are formed to cover the slant surfaces.

10. The magnetic sensor as claimed in claim 1, wherein said sensor has an anisotropically etched substrate having surfaces that are slanted relative to each other, and the magnetoresistance effect elements are disposed on the slanted surfaces.

11. The magnetic sensor as claimed in claim 10, wherein the substrate has a concave section and the slanted surfaces are formed on the concave section.

12. The magnetic sensor as claimed in claim 1, further comprising a base layer having a mesa shape on a substrate, and the magnetoresistance effect elements are formed into a mesa shape by stacking layers on the base layer.

13. The magnetic sensor as claimed in claim 1, further comprising a giant magnetoresistance effect element.

14. The magnetic sensor as claimed in claim 1, further comprising a tunneling magnetoresistance effect element.

15. A manufacturing method of a magnetoresistance effect element which is used in a magnetic sensor, wherein the magnetoresistance effect element includes a soft layer whose magnetization easy direction is changed by a of an external magnetic field; and a magnetization fixing layer whose magnetization is fixed by direction having a magnetic layer and an anti-ferromagnetic layer; and a magnetoresistance effect is generated by a change of electric conduction which is caused by a relative angle between the magnetization easy direction of the soft layer and the magnetization direction of the magnetization fixing layer; and the manufacturing method, comprising:

a thin film forming step which forms the magnetization fixing layer into a thin film; and a magnetization applying step which forms a magnetization direction of the magnetization fixing layer by applying a magnetic field to the magnetization fixing layer from a direction other than a film surface direction of the magnetization fixing layer.

16. The manufacturing method of the magnetoresistance effect element as claimed in claim 15, wherein: when two or more magnetoresistance effect elements are disposed in the magnetic sensor so that the magnetic sensor detects two or more vectors of the magnetic fields, the magnetization applying step applies the magnetic field to each magnetization fixing layer so that the magnetization directions are different among the plural magnetization fixing layers.

17. The manufacturing method of the magnetoresistance effect element as claimed in claim 16, wherein: the magnetization applying step makes the magnetization directions of the magnetization fixing layers multi-axes in the magnetic sensor.

18. The manufacturing method of the magnetoresistance effect element as claimed in claim 15, wherein: the magnetization fixing formed of a substance having a high magnetic coercive force.

19. The manufacturing method of the magnetoresistance effect element as claimed in claim 15, wherein: the magnetization fixing layer has a spin-valve structure in which the magnetization direction is fixed by an exchange-coupled magnetic field being applied on a boundary surface between the magnetic layer and the anti-ferromagnetic layer.

20. The manufacturing method of the magnetoresistance effect element as claimed in claim 15, further comprising: an auxiliary magnetic field generating step which generates an auxiliary magnetic field so that the magnetization direction of the magnetization fixing layer is fixed.

* * * * *